(12) United States Patent
Iwane et al.

(10) Patent No.: US 7,593,823 B2
(45) Date of Patent: Sep. 22, 2009

(54) METHOD AND DEVICE FOR DETERMINING STATE OF BATTERY, AND BATTERY POWER SUPPLY SYSTEM THEREWITH

(75) Inventors: Noriyasu Iwane, Tokyo (JP); Keiko Chikazawa, Tokyo (JP); Keisuke Morii, Tokyo (JP)

(73) Assignee: The Furukawa Electric Co., Ltd, Tokyo (JP)

( * ) Notice: Subject to any disclaimer, the term of this patent is extended or adjusted under 35 U.S.C. 154(b) by 107 days.

(21) Appl. No.: 11/934,934

(22) Filed: Nov. 5, 2007

(65) Prior Publication Data
US 2008/0120050 A1    May 22, 2008

(30) Foreign Application Priority Data
Nov. 21, 2006  (JP)  .............................. 2006-313853
Dec. 25, 2006  (JP)  .............................. 2006-347080

(51) Int. Cl.
*G06F 19/00* (2006.01)
(52) U.S. Cl. .......................... 702/63; 702/64; 320/132; 320/136; 324/430; 324/431
(58) Field of Classification Search .................. 702/63, 702/64; 320/127, 132, 134, 136–137; 324/430, 324/431
See application file for complete search history.

(56) References Cited

U.S. PATENT DOCUMENTS 6,885,951 B2 *   4/2005   Richter ........................ 702/63

2004/0128089 A1   7/2004   Barsoukoy et al.
2008/0120050 A1   5/2008   Iwane et al.

OTHER PUBLICATIONS

U.S. Appl. No. 12/041,972, filed Mar. 4, 2008, Iwane.
U.S. Appl. No. 12/049,907, filed Mar. 17, 2008, Iwane, et al.

* cited by examiner

*Primary Examiner*—Drew A Dunn
*Assistant Examiner*—Hien X Vo
(74) *Attorney, Agent, or Firm*—Oblon, Spivak, McClelland, Maier & Neustadt, P.C.

(57) ABSTRACT

Coefficients A and B are calculated from the measured temperature and the measured state of charge. Next, a response voltage Vc is calculated by substituting the measured internal impedance X into a response-voltage correlation equation. Besides, by comparing the response voltage Vc with a predetermined threshold V0, if Vc is bigger than or equal to V0, the battery is determined as normal. By substituting the measured values of internal impedance, temperature, and SOC into the internal impedance calculation formula, a final internal impedance calculation formula is determined by calculating the value of C by an iterating operation. Next, in the case of determining SOH of a battery, by substituting a standard temperature and a standard SOC into the final internal impedance calculation formula, the internal impedance to determine the SOH is calculated. By comparing the internal impedance with SOH determination threshold, the SOH of the battery is determined.

20 Claims, 28 Drawing Sheets

NEW BATTERY

|  |  |  | TEMPERATURE AT MEASUREMENT | | | | |
|---|---|---|---|---|---|---|---|
|  |  |  | -10 | 0 | 10 | 25 | 45 |
| SOC AT MEASUREMENT (%) | 100 | MEASURED VALUE | 32.82734 | 26.64877 | 24.19724 | 21.7 | 20.68664 |
|  |  | ESTIMATED VALUE | 22.25585 | 21.80062 | 22.15133 | 21.7 | 21.54955 |
|  | 80 | MEASURED VALUE | 32.36193 | 26.54122 | 23.96252 | 21.67795 | 20.9469 |
|  |  | ESTIMATED VALUE | 21.92558 | 21.66459 | 21.88455 | 21.59619 | 21.75079 |
|  | 50 | MEASURED VALUE | 32.21486 | 27.08837 | 24.86215 | 22.73729 | 22.01915 |
|  |  | ESTIMATED VALUE | 21.29128 | 21.39979 | 21.87037 | 21.73907 | 21.92654 |
|  | 30 | MEASURED VALUE | 35.11432 | 30.75813 | 28.25606 | 25.59212 | 24.53036 |
|  |  | ESTIMATED VALUE | 20.85542 | 21.42077 | 21.66268 | 20.95343 | 20.65501 |

(a)

DETERIOTATED BATTERY

|  |  |  | TEMPERATURE AT MEASUREMENT | | | | |
|---|---|---|---|---|---|---|---|
|  |  |  | -10 | 0 | 10 | 25 | 45 |
| SOC AT MEASUREMENT (%) | 100 | MEASURED VALUE | 49.25162 | 42.02878 | 37.77637 | 32.75609 | 30.99985 |
|  |  | ESTIMATED VALUE | 33.24359 | 33.44566 | 33.80853 | 32.75609 | 33.29383 |
|  | 80 | MEASURED VALUE | 49.19301 | 42.06857 | 37.53977 | 33.02926 | 31.21655 |
|  |  | ESTIMATED VALUE | 33.14209 | 33.41246 | 33.53054 | 32.9475 | 33.44805 |
|  | 50 | MEASURED VALUE | 50.50401 | 42.69234 | 38.88196 | 34.5005 | 32.74372 |
|  |  | ESTIMATED VALUE | 33.42767 | 33.18112 | 33.90234 | 33.50228 | 34.14591 |
|  | 30 | MEASURED VALUE | 55.3006 | 46.43175 | 42.94777 | 37.79627 | 36.08412 |
|  |  | ESTIMATED VALUE | 34.26953 | 33.25929 | 34.27418 | 33.15758 | 33.80303 |

METHOD AND DEVICE FOR DETERMINING STATE OF BATTERY, AND BATTERY POWER SUPPLY SYSTEM THEREWITH

BACKGROUND OF THE INVENTION

1. Field of the Invention

The present invention relates to a method and a device for determining state of a battery, and a battery power supply system, for determining SOF or SOH of a battery.

2. Related Arts

The technology for determining state of function (SOF) (i.e., discharge capability) or state of health (SOH) (i.e., deterioration level) of a battery by monitoring a battery is, especially in the field of vehicles or the like, an extremely important technology in order to achieve safe and comfortable driving. A method for determining SOF or SOH of a battery has been proposed until now. For example, a method disclosed in Japanese Patent Application Publication No. 2005-037380 has been known.

As for the method disclosed in Japanese Patent Application Publication No. 2005-037380, SOF or SOH of a battery is determined on the basis of the internal impedance or internal resistance of a battery. That is, when the response voltage calculated from the internal impedance or internal resistance of the battery becomes less than or equal to a predetermined threshold, it is determined that the SOF of the battery is lacking, or the SOH thereof is low. In this case, as internal impedance or internal resistance varies with temperature and state of charge (SOC) of a battery, it is required that the voltage between terminals being used for the determination be converted to the value at a predetermined temperature and SOC.

Also, in Japanese Patent Application Publication No. 2005-037380, it is reported that a response voltage subjected to a constant current discharge has a linear relation with the internal impedance, on the condition that temperature and SOC of a battery are constant. According to the disclosure, in the case where the temperature and the SOC of the battery satisfies with a prescribed condition, it is possible to determine SOF or SOH of the battery by obtaining the above mentioned response voltage.

However, in the actual battery power supply systems, particularly, in batteries for vehicles or other, the condition of temperature and SOC of the battery been kept at a constant state almost has not been achieved. In practice, the temperature and the SOC vary with the operating conditions or the like, and the correlation between the response voltage and the internal impedance or the internal resistance used as an index for SOF or SOH, varies with the change of the temperature and the SOC. Therefore, in the case of calculating a response voltage by using a correlative function of internal impedance or internal resistance, it is required that the correlative function is corrected responding to the variation of the temperature and the SOC.

As described above, it is required that the internal impedance or the like used for determining SOF or SOH of the battery is corrected for the effect of the temperature and the SOC of the battery. As one of conventional methods for performing temperature correction with high accuracy, for example, a method described in Japanese Patent Application Publication No. 2005-091217 is known. In the Japanese Patent Application Publication No. 2005-091217, a method for forecasting calculation of the internal impedance at any temperature from the internal impedance measured at a certain temperature is disclosed.

Besides, in recent years, the use of a portable terminal unit or the like as an electronics device is expanding, and the importance of a battery mounted on portable terminal units or the like is increasing. Also, in the field of vehicle, along with the prevailing of start-stop system, the technology which can grasp state of battery accurately has come to be desired strongly. Thus, along with the importance of battery rising considerably, the necessity of detecting state of a battery, by monitoring the battery, arises naturally. To cope with this, the art for estimating SOH or SOF of a battery has been proposed so far.

Conventionally, as a method for estimating SOH or SOF of a battery, a method using internal impedance or internal resistance of a battery as an index has been contrived. According to this method, there rises a problem that determining true SOH and SOF is difficult, because the value of internal resistance or internal impedance is affected by the temperature or SOC of the battery. In order to resolve such a problem, for example, the art disclosed in Japanese Patent Application Publication No. 2001-228226 is proposed.

In the Japanese Patent Application Publication No. 2001-228226, a method that making a temperature correction for internal impedance, and then comparing the corrected value with a threshold determined responding to SOC is proposed.

However, as described above, as it is required that a correlative function between the response voltage at constant current discharge and the internal impedance or the internal resistance is corrected responding to the deviation of temperature and SOC of a battery, the art for correcting the coefficients of the correlation function with high accuracy has not been know until now. Therefore, there is a problem that SOF and SOH of a battery can not be determined with high accuracy.

In the art disclosed in the Japanese Patent Application Publication No. 2005-037380, a concrete method for making a temperature correction for internal resistance is not disclosed. And, the method is such a complicated as to need making a correction for determination threshold as well as for internal resistance, thus, there is a problem that handling the method is difficult. Besides, in order to estimate SOF by using this method, there needs for calculation momentarily with tracing application process, thus, the forecasting calculation of internal impedance value responding to the temperature and the SOC at each moment is needed. Accordingly, in practice, there is a problem that the art disclosed in Japanese Patent Application Publication No. 2005-037380 can not fully evaluate as SOF.

Also, in the art disclosed in the Japanese Patent Application Publication No. 2005-091217, there is no description of the effect caused by SOC, and there is a problem that the art can not fully respond to determining SOH and SOF, when the effect caused by SOC is strong. As the effect caused by SOC becomes strong in a region of the low SOC, thus, the art disclosed in the Japanese Patent Application Publication No. 2005-037380 becomes difficult to fully respond to the battery which is supposed to be used under such a condition.

So, the present invention is made to solve these problems. An object of the present invention is, by correcting the effect caused by the change of temperature and the SOC of the battery, to provide a method for determining state of a battery so as to determine SOF and SOH with high accuracy.

SUMMARY OF THE INVENTION

The first embodiment of the method of the invention for determining state of a battery is the method for determining state of a battery by estimating response voltage when a predetermined discharge current pattern is applied, to determine SOF (State Of Function) or SOH (State Of Health) of a battery, comprising the steps of:

preparing in advance a prescribed correlative equation, a plurality of coefficients of which are given by functions of the temperature and the SOC (State Of Charge) of the battery, which calculates the response voltage when a predetermined discharge current pattern is applied, by using measured value of either the internal impedance or the internal resistance of the battery;

determining the values of the coefficients by measuring the temperature and the SOC of the battery;

substituting the measured value of either the internal impedance or the internal resistance in the correlative equation with the values of the coefficients incorporated to calculate the response voltage when the predetermined discharge current pattern is applied; and determining the SOF and the SOH of the battery based on the response voltage thus calculated.

In one of other embodiments of the method of the invention for determining state of a battery, the correlative equation is expressed in at least one of a polynomial function, an exponential function, and a reciprocal function.

In one of other embodiments of the method of the invention for determining state of a battery, the coefficients of the correlative equation are expressed in at least one of a polynomial function, an exponential function, and a reciprocal function of the temperature and the SOC.

In one of other embodiments of the method of the invention for determining state of a battery, the coefficients of the correlative equation are expressed in function of the temperature, and the coefficients of the function of the temperature are expressed in functions of the SOC.

In one of other embodiments of the method of the invention for determining state of a battery, the function of the temperature or the function of the SOC comprises at least one of a polynomial function, an exponential function, and a reciprocal function.

In one of other embodiments of the method of the invention for determining state of a battery, the coefficients of the correlative equation are expressed in function of the SOC, and the coefficients of the function of the SOC are expressed in functions of the temperature.

In one of other embodiments of the method of the invention for determining state of a battery, the function of the SOC or the function of the SOC comprises at least one of a polynomial function, an exponential function, and a reciprocal function.

The first embodiment of the device for monitoring state of a battery is the device comprising:

an internal impedance measurement unit configured to measure either internal impedance or internal resistance of a battery;

a temperature sensor configured to measure the temperature of the battery;

an SOC sensor configured to measure the SOC of the battery; and a controller in which a prescribed correlative equation is memorized in advance, a plurality of coefficients of which are given by functions of the temperature and the SOC (State Of Charge) of the battery, which calculates the response voltage when a predetermined discharge current pattern is applied, by using a measured value of either the internal impedance or the internal resistance of the battery, the values of the coefficients is determined by measuring the temperature and the SOC of the battery, the measured value of either the internal impedance or the internal resistance is substituted in the correlative equation with the values of the coefficients incorporated to calculate the response voltage while the predetermined discharge current pattern is applied, and the SOF and the SOH of the battery are determined based on the response voltage thus calculated.

The first embodiment of the battery power supply system is the system including the battery and the device for monitoring state of a battery described above.

One of other embodiments of the method of the invention for determining state of a battery is the method comprising the steps of:

preparing in advance a calculation formula to calculate internal resistance or internal impedance of a battery expressed by a predetermined function including at least one of a polynomial function, an exponential function, and a reciprocal function of temperature and SOC, a plurality of coefficients thereof being functions of one specified parameter;

obtaining respective measured values by simultaneously measuring one of the internal resistance and the internal impedance, as well as the temperature and the SOC of the battery;

calculating the specified parameter value by substituting the respective measured values into the calculation formula;

determining the coefficients from the calculated specified parameter value;

substituting the predetermined temperature and the predetermined SOC in a complete calculation formula using determined coefficients to estimate either the internal resistance or the internal impedance; and applying either the estimated internal resistance or the estimated internal impedance as an index to determine the SOH of the battery.

In one of other embodiments of the method of the invention for determining state of a battery, as the predetermined temperature and the predetermined SOC, a standard temperature and a standard SOC for determining the SOH of the battery are used.

In one of other embodiments of the method of the invention for determining state of a battery, the temperature and the SOC at a time when the SOF of the battery is determined are used as the predetermined temperature and the predetermined SOC.

In one of other embodiments of the method of the invention for determining state of a battery, the calculation formula for calculating either the internal resistance or the internal impedance is expressed by the first function including at least one of a polynomial function, an exponential function, and a reciprocal function of the temperature, and at the same time at least one of the coefficients of the first function is expressed by the second function including at least one of a polynomial function, an exponential function, and a reciprocal function of the SOC, and further a plurality of coefficients of the first function and the second function are expressed by functions of the specified parameter.

In one of other embodiments of the method of the invention for determining state of a battery, the calculation formula for calculating either the internal resistance or the internal impedance is expressed by the third function including at least one of a polynomial function, an exponential function, and a reciprocal function of the SOC, and at the same time at least one coefficient of the third function is expressed by the forth function including at least one of a polynomial function, an exponential function, and a reciprocal function of temperature, and further a plurality of coefficients of the third function and the fourth functions are expressed by functions of the specified parameter.

In one of other embodiments of the device of the invention for determining state of a battery is the device for determining state of a battery by estimating either internal resistance or internal impedance of a battery at predetermined temperature and predetermined SOC, and applying either the estimated internal resistance or the estimated internal impedance as an index to determine the state of a battery, the device comprising:

an internal impedance measurement unit configured to measure either internal impedance or internal resistance of a battery;

a temperature sensor configured to measure temperature of the battery;

an SOC sensor configured to measure SOC of the battery; and a controller configured to prepare in advance and store a calculation formula for calculating either the internal resistance or the internal impedance expressed by a function including at least one of a polynomial function, an exponential function, and a reciprocal function of the temperature and the SOC with a plurality of coefficients thereof expressed by functions of one specified parameter, input respective measured values of either the internal resistance or the internal impedance, as well as the temperature and the SOC which are simultaneously measured by the internal impedance measurement unit, the temperature sensor and the SOC sensor, substitute the measured values of either the internal resistance or the internal impedance, as well as the temperature and the SOC in the calculation formula to calculate the specified parameter, and substitute the predetermined temperature and the predetermined SOC in a complete calculation formula using the coefficients determined from the calculated specified parameter to estimate either the internal resistance or the internal impedance.

In one of other embodiments of the device of the invention for determining state of a battery, the controller, using a standard temperature and a standard SOC as the predetermined temperature and the predetermined SOC for determining the SOH of the battery, is configured to substitute the standard temperature and the standard SOC in the complete calculation formula to estimate either the internal resistance or the internal impedance, and apply either the estimated internal resistance or the estimated internal impedance as an index to determine the SOH of the battery.

In one of other embodiments of the device of the invention for determining state of a battery, the controller, using the temperature and the SOC at the time when the SOF of the battery is measured as the predetermined temperature and the predetermined SOC, is configured to substitute the temperature and the SOC at the time when SOF of the battery is measured in the complete calculation formula to estimate the internal resistance or the internal impedance, and apply the estimated internal resistance or the internal impedance as an index to determine the SOF of the battery.

In one of other embodiments of the device of the invention for determining state of a battery, the controller is configured to use a calculation formula for calculating either the internal resistance or the internal impedance expressed by the first function including at least one of a polynomial function, an exponential function, and a reciprocal function of the temperature, and at least one of a plurality of coefficients of the first function is expressed by the second function including at least one of a polynomial function, an exponential function, and a reciprocal function of the SOC, and further a plurality of coefficients of the first function and the second function are expressed by functions of the specified parameter.

In one of other embodiments of the device of the invention for determining state of a battery, the controller configured to use a calculation formula calculating either the internal resistance or the internal impedance expressed by the third function including at least one of a polynomial function, an exponential function, and a reciprocal function of the SOC, and at least one of a plurality of coefficients of the third function is expressed by the forth function including at least one of a polynomial function, exponential function, and reciprocal function of the temperature, and further a plurality of coefficients of the third function and the forth function are expressed by functions of the specified parameter.

In one of other embodiments of the battery power supply system is the system including the device for determining state of a battery as described above.

BRIEF DESCRIPTION OF THE DRAWINGS

FIG. 29 is a profile showing the estimation result of the internal impedance by using the final internal impedance calculation formula.

DETAILED DESCRIPTION OF THE INVENTION

A method for determining state of a battery, a device for monitoring state of a battery, and battery power supply system in preferable embodiments of the present invention are explained in detail, with reference to the attached drawings.

In a method for determining state of a battery of the present invention, SOF or SOH of a battery is determined based on whether response voltage when a prescribed constant current is discharged from the battery is bigger than a threshold or not.

Figure 2:
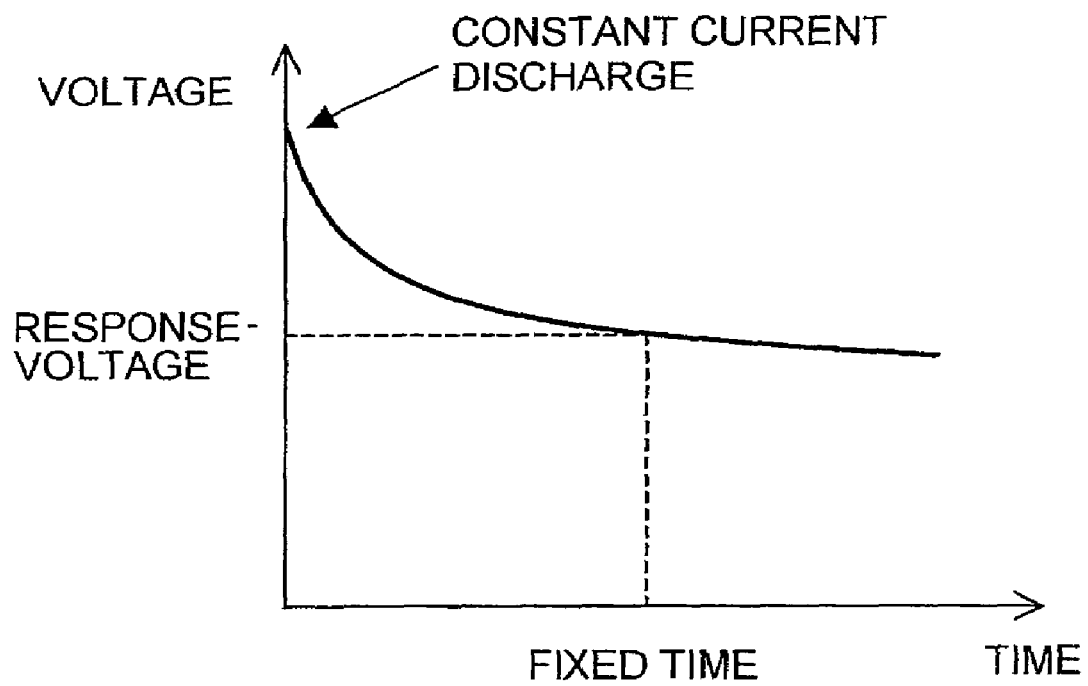
FIG. 2 is a figure showing a response voltage when performing a constant current discharge.

Specifically, as shown in FIG. 2, a constant current, for example, 10 A or 100 A is discharged, it is determined whether SOF or SOH of a battery is appropriate or not, based on whether the response voltage value is bigger than a threshold value or not, at a time when a fixed time is passed after the start of the discharge. The magnitude of the discharge current of which the response voltage is to be estimated, or a threshold or the like for determining SOF or SOH of a battery may be determined on the basis of the permissible minimum value or the like of the operating voltage required by a load to which the power is supplied from the battery.

Since the above described response voltage has strong correlation with the internal resistance or the internal impedance of the battery, the method for determining state of a battery of the present invention estimates the response voltage from the internal impedance or the internal resistance, using a prescribed correlative equation (hereinafter referred to as "response-voltage correlative equation"). Also, the response-voltage correlative equation is given by at least one of a polynomial function, an exponential function and a reciprocal function using a variable of the internal resistance or the internal impedance of the battery.

An example of the response-voltage correlative equation is shown herein below. In the case where the response voltage is represented by Vc, and the internal impedance or the internal resistance is represented by X, the response-voltage correlative equation in a polynomial function can be expressed as follows:

$$Vc = a0 + a1 \cdot X + a2 \cdot X^2 + \ldots, + an \cdot X^n \quad \text{(equation 1)}$$

Also, the following is an equation with the response-voltage correlative equation expressed in an exponential function.

$$Vc = b0 + b1 \cdot \exp(c1 \cdot X) + b2 \cdot \exp(c2 \cdot X) + \ldots, + bn \cdot \exp(cn \cdot X) \quad \text{(equation 2)}$$

Further, the following is an equation with the response-voltage correlative equation expressed in a reciprocal function.

$$Vc = c0 + (1 + c1 \cdot X + c2 \cdot X + \ldots + cn-1 \cdot X^{n-1})/(d0 + d1 \cdot X + \ldots + dn \cdot X^n) \quad \text{(equation 3)}$$

In addition, the response-voltage correlative equation can be expressed in a combination of the equation 1, the equation 2, and the equation 3, where ai, bi, ci, and di (i=0 to n) represent coefficients determined by fitting the functions to experimental data or the like.

Figure 3:
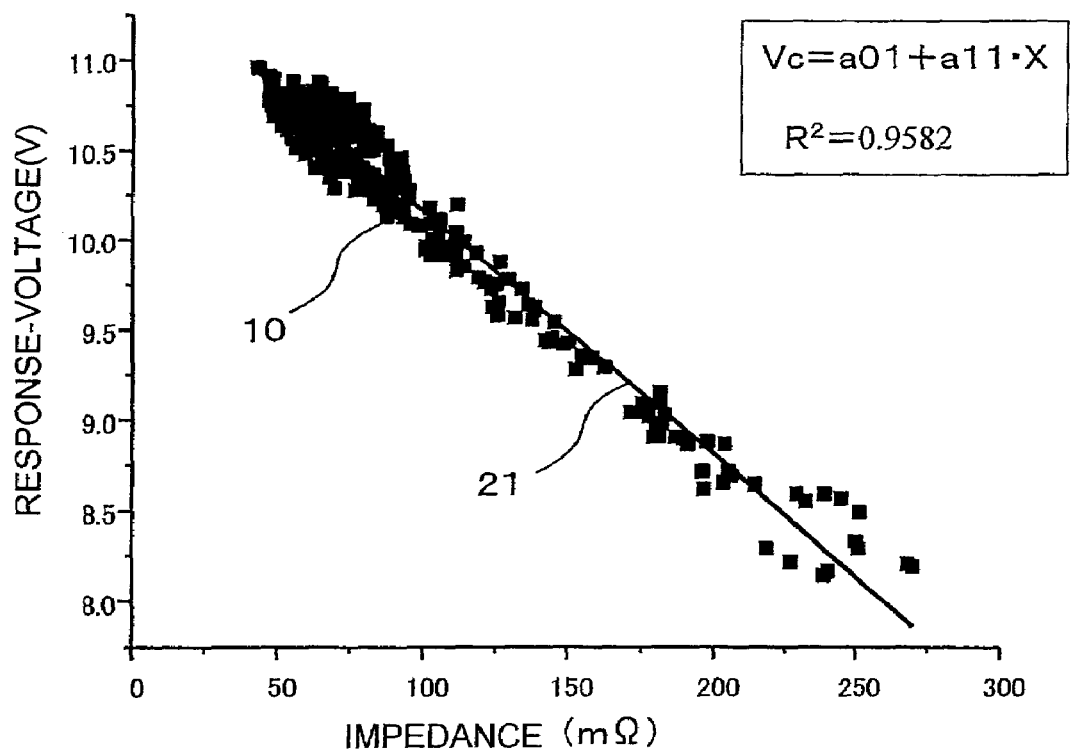
FIG. 3 is a comparative chart of measured response voltage values to the response-voltage calculated with correlative equation of a polynomial function of the first degree.
Figure 4:
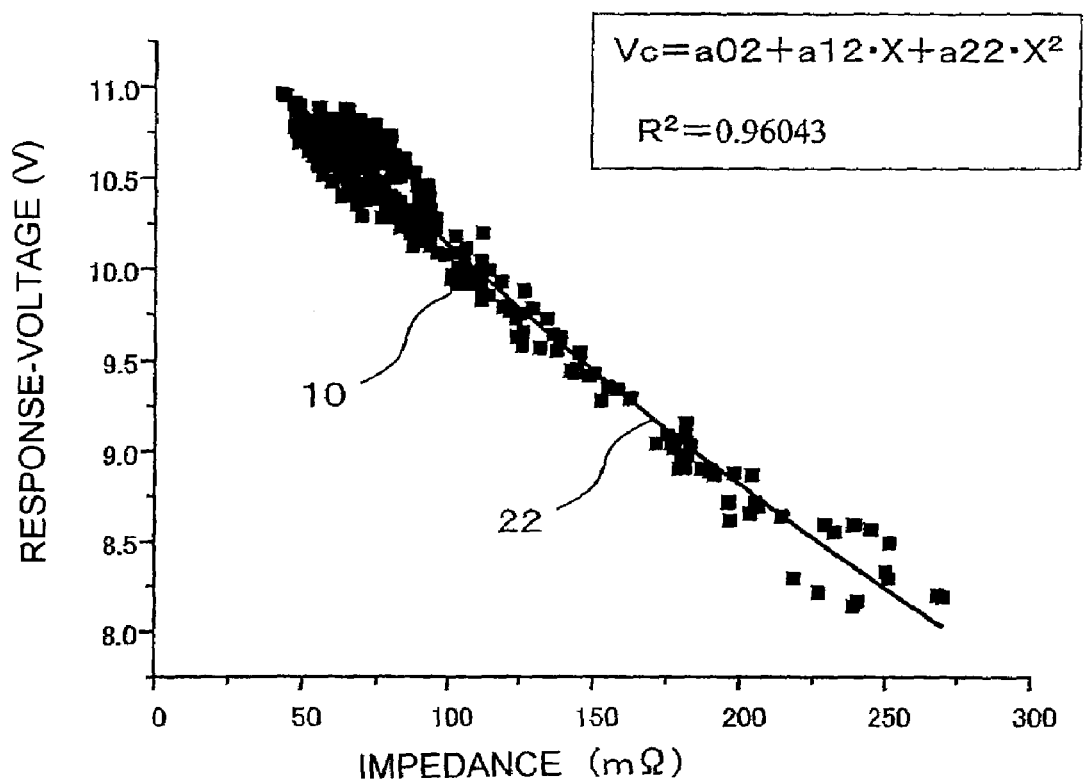
FIG. 4 is a comparative chart of measured response voltage values to the response-voltage calculated with correlative equation of a polynomial function of the second degree.
Figure 5:
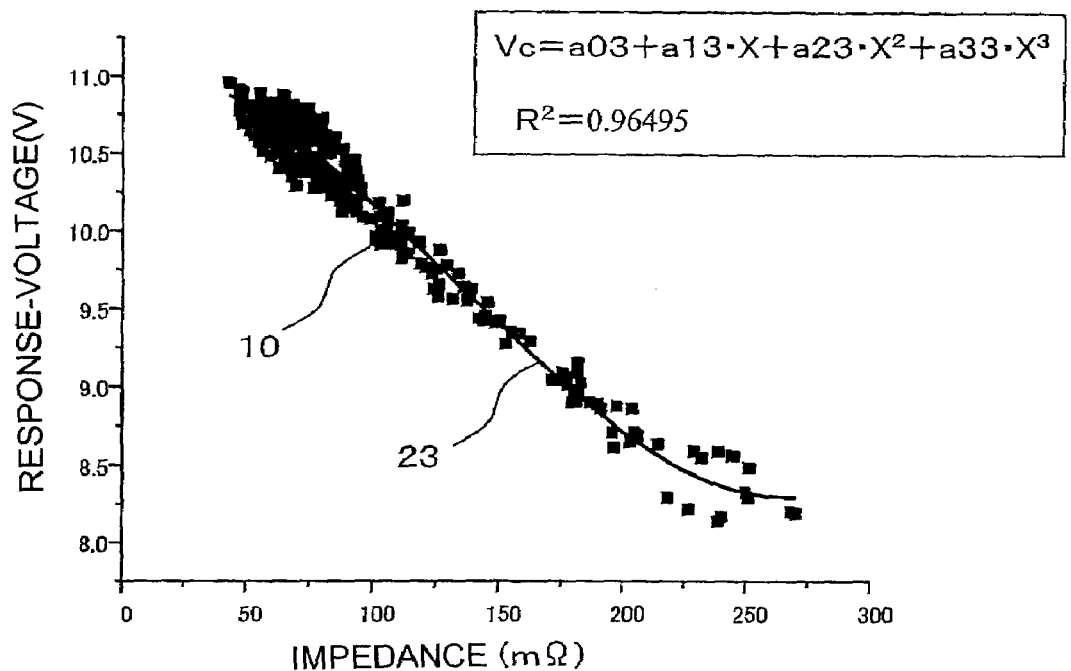
FIG. 5 is a comparative chart of measured response voltage values to the response-voltage calculated with correlative equation of a polynomial function of the third degree.
Figure 6:
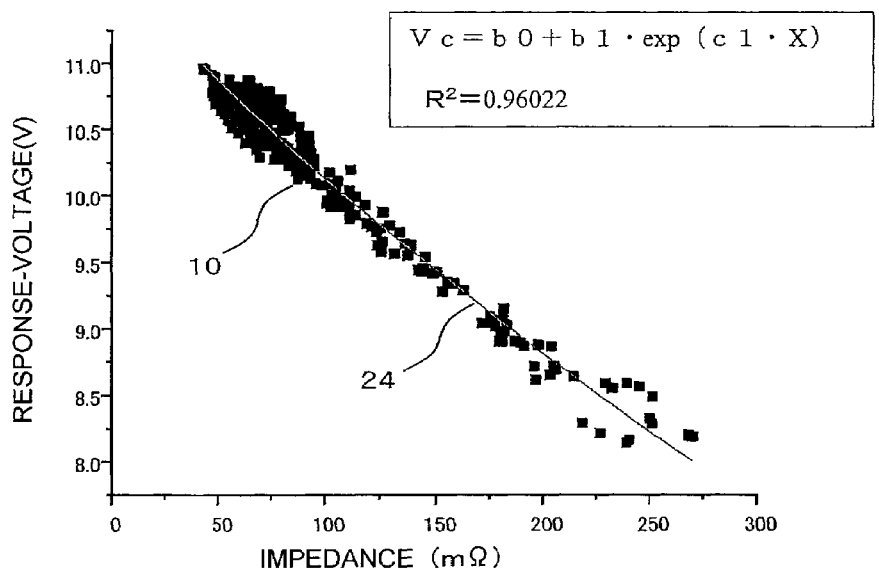
FIG. 6 is a comparative chart of measured response voltage values to the response-voltage calculated with correlative equation of an exponential function.
Figure 7:
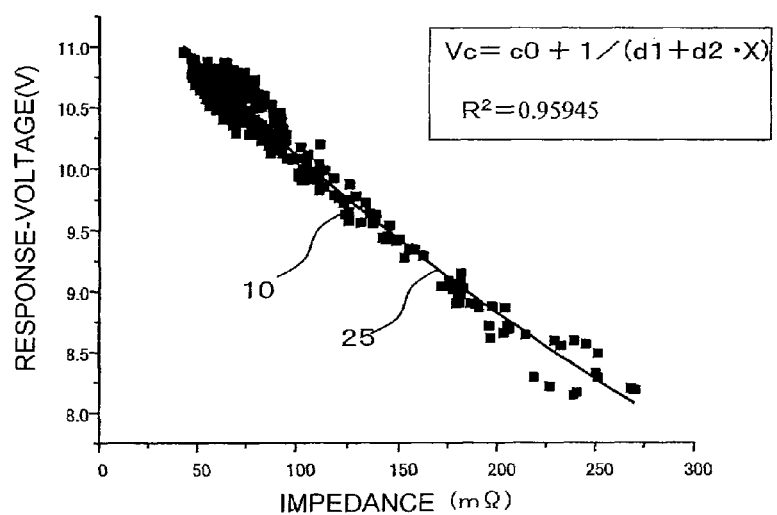
FIG. 7 is a comparative chart of measured response voltage values to the response-voltage calculated with correlative equation of a reciprocal function.

FIG. 3 to FIG. 5 show examples of the above equation 1 used as the response-voltage correlative equation. FIG. 6 shows an example of the equation 2 used as the response-voltage correlative equation. Furthermore, FIG. 7 shows an example of the equation 3 used as the response-voltage correlative equation (In the figures, the response-voltage correlative equations are represented by reference numerals 21 to 25). Measured data 10 shown in each figure express the response voltages measured while being discharged in the predetermined constant current, the predetermined temperature and the predetermined SOC condition. The measured data 10 shows that the response voltage becomes lower as internal impedance becomes larger although spreading appears in the data.

FIG. 3 to FIG. 5 in which the response-voltage correlative equations 21 to 23 expressed in polynomial functions are compared with the measured data 10 indicate the results when the response-voltage correlative equation is expressed by the first degree polynomial function, the second degree polynomial function, and the third degree polynomial function of the internal impedance, respectively. That is, the response-voltage correlative equations 21 to 23 expressed in the polynomial functions in FIG. 3 to 5 are respectively expressed as follows:

$$Vc = a01 + a11 \cdot X \quad \text{(equation 4)}$$

$$Vc = a02 + a12 \cdot X + a22 \cdot X^2 \quad \text{(equation 5)}$$

$$Vc = a03 + a13 \cdot X + a23 \cdot X^2 + a33 \cdot X^3 \quad \text{(equation 6)}$$

The response-voltage correlative equation 24 expressed in the exponential function in FIG. 6 is expressed as follows:

$$Vc = b0 + b1 \cdot \exp(b2 \cdot X) \quad \text{(equation 7)}$$

Furthermore, the response-voltage correlative equation 25 expressed in the reciprocal function in FIG. 7 is expressed as follows:

$$Vc = c0 + 1/(d1 + d2 \cdot X) \quad \text{(equation 8)}$$

In FIGS. 3 to 7, $R^2$ denote the value $R^2$ which indicates the strength of correlation between the above described response-voltage correlative equation 21 to 25 and measured data 10. In the response-voltage correlative equations 21 to 23 expressed in the polynomial functions, the $R^2$ value becomes larger as the order of the equation becomes higher, thus enabling approximation with higher accuracy. Furthermore, the $R^2$ value of the response-voltage correlative equation 24 expressed in the exponential function is the same degree of magnitude as that of the response-voltage correlative equation 22 expressed in the second degree polynomial function.

In FIG. 3 to 7, response voltages are shown in the case that temperature and SOC of the battery are fixed. But the relationship between the response voltage and the internal impedance shown in FIG. 3 to 7 varies with the change of temperature and SOC of the battery. Thus, in the method for determining state of a battery in the present invention, each coefficient of the response-voltage correlative equations shown in equation 1 to equation 3, or equation 4 to equation 8, is made to be function of temperature and SOC of the battery, and each coefficient is converted to a value at a predetermined temperature and SOC. In the following, a method of high-accurate approximation, with each coefficient being a function of the temperature and SOC of the battery, is explained with reference to the response-voltage correlative equation 21 of a polynomial function of first degree as one example.

The coefficient of response-voltage correlative equation 21 shown in equation 4 is replaced by the following simple equation.

$$Vc = A \cdot X + B \quad \text{(equation 9)}$$

Hereunder, a method of a high-accurate approximation of coefficient A and B, with coefficient A and B being a function of temperature and SOC of a battery, is explained.

In the method for determining state of a battery of the present invention, each coefficient of response-voltage correlative equation is given in at least one of a polynomial function, an exponential function, and a reciprocal function using a variable of temperature and SOC of a battery. In the following, firstly, the change of coefficient A and B is explained under the condition when temperature and SOC are changed. The value of each coefficient is the value obtained by optimizing the response-voltage correlative equation (equation 9) for the measured response-voltage values at each temperature and SOC.

Figure 8:
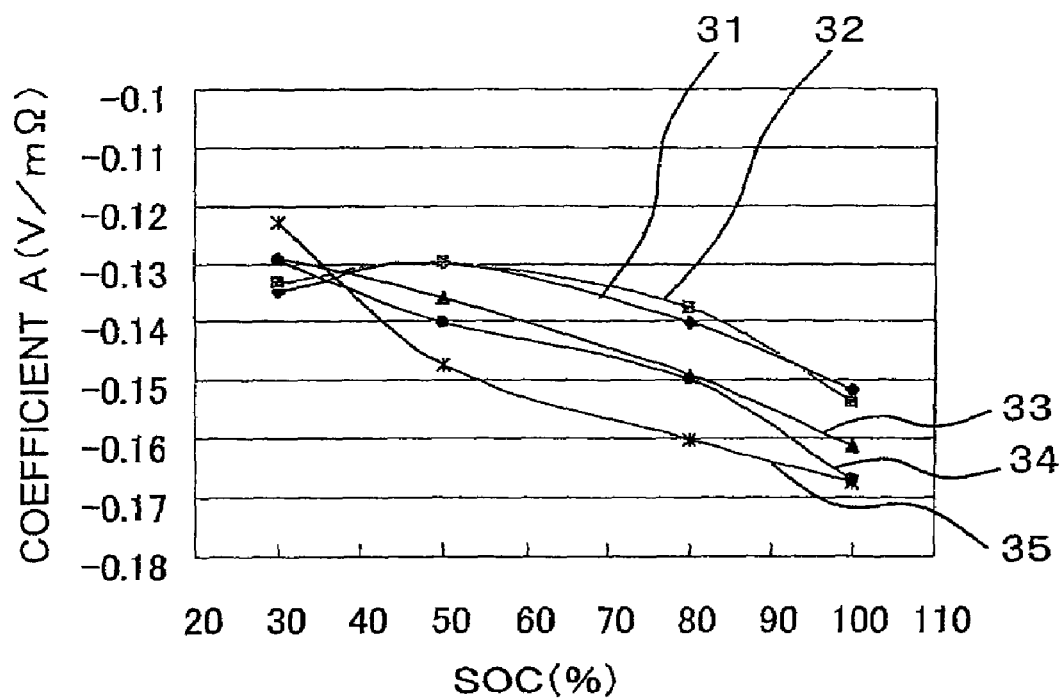
FIG. 8 is a profile showing the change of coefficient A against temperature and SOC of a battery.

FIG. 8 shows the change of coefficient A of equation 9 corresponding to the change of temperature and SOC of a battery. In the figure, the change of the coefficient A when the SOC is changed is shown by plotting (reference numerals 31 to 35 respectively) at each of five different temperature levels (hereinafter referred to as "T1 to T5"). From the figure, it is recognizable that the coefficient A varies in nonlinearity to SOC, and further the tendency of the change is substantially different depending on temperature.

Figure 9:
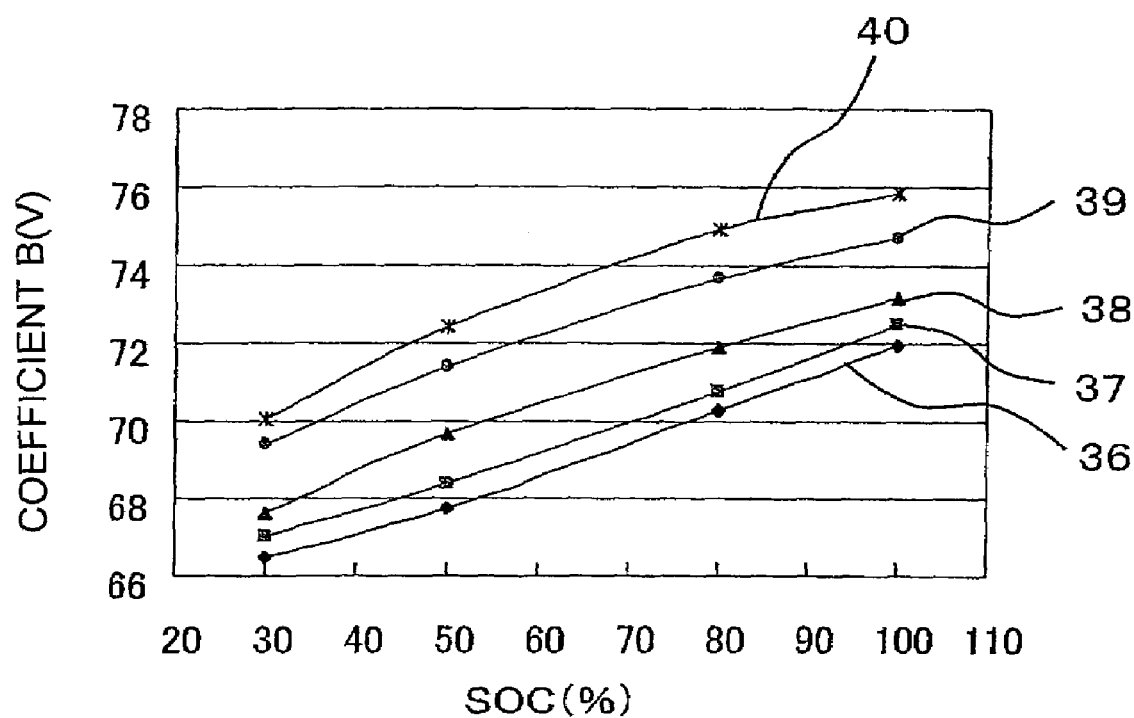
FIG. 9 is a profile showing the change of coefficient B against temperature and SOC of a battery.

FIG. 9 shows the change of the coefficient B of the equation 9 corresponding to the change of the temperature and SOC of the battery. In the figure, also the change of the coefficient B corresponding to the change of the SOC is shown by plotting (reference numerals 36 to 40 respectively) at each different temperature level. As the same to the coefficient A, it is recognizable that the coefficient B varies in nonlinearity to SOC, and further the tendency of the change is substantially different depending on temperature.

As described above, both of the coefficients A and B of equation 9 varies complicatedly in nonlinearity with the change of temperature and SOC of the battery. Thus, in the method for determining the state of the battery of the present invention, the optimal approximation of the complicated change of the coefficient A and B can be made by function s including at least one of a polynomial function, exponential function and reciprocal function of temperature and SOC of the battery.

In the following, an optimized example is shown, in which a polynomial function and an exponential function are combined, with coefficient A being a function of temperature and SOC. The coefficient A can be expressed in the combination of the polynomial function and the exponential function as follows:

$$A = P1 \cdot \exp(-SOC/P2) + P3 \cdot SOC + P4 \quad \text{(equation 10)}$$

$$P1 = A1 \cdot \exp(-T/A2) + A3 \quad \text{(equation 11)}$$

$$P2 = A4 \cdot T + A5 \quad \text{(equation 12)}$$

$$P3 = A6 \cdot T + A7 \quad \text{(equation 13)}$$

$$P4 = A8 \cdot T + A9 \quad \text{(equation 14)}$$

Here, T and SOC represent temperature and SOC of a battery respectively.

Figure 10:
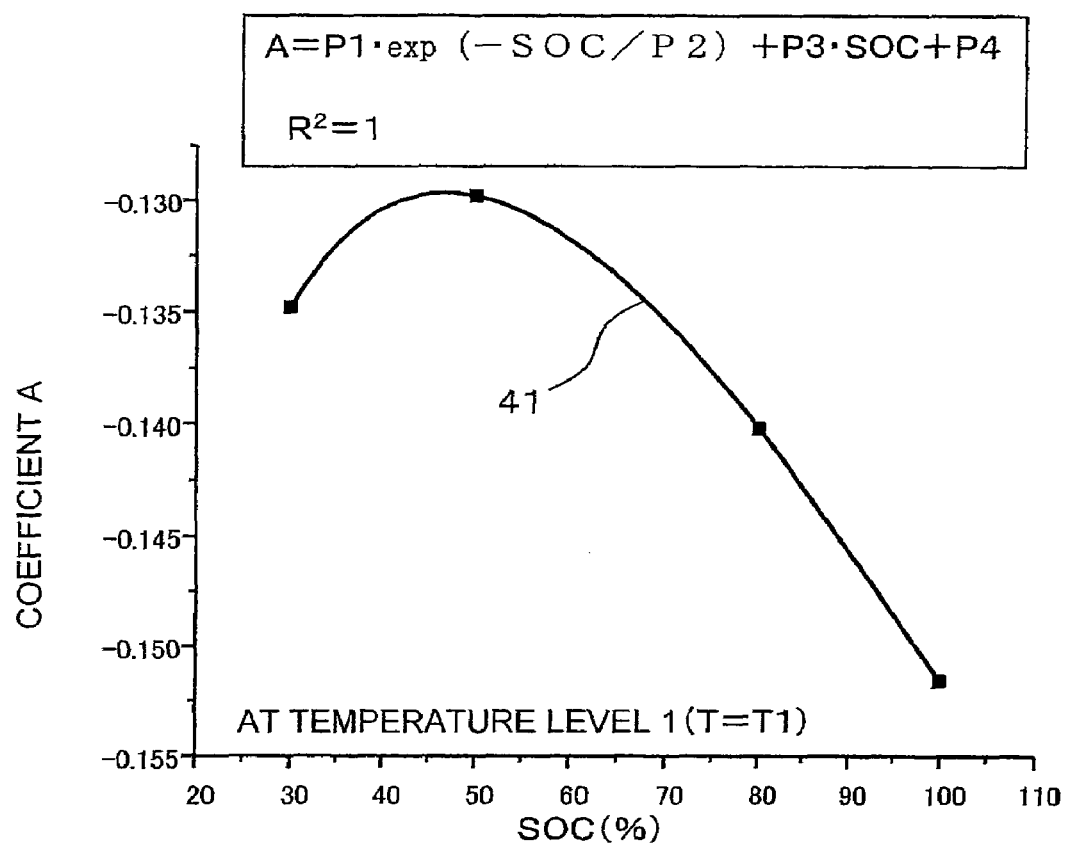
FIG. 10 is a profile showing the result of optimum fitting of a function to the SOC dependency of coefficient A (at temperature level 1)
Figure 11:
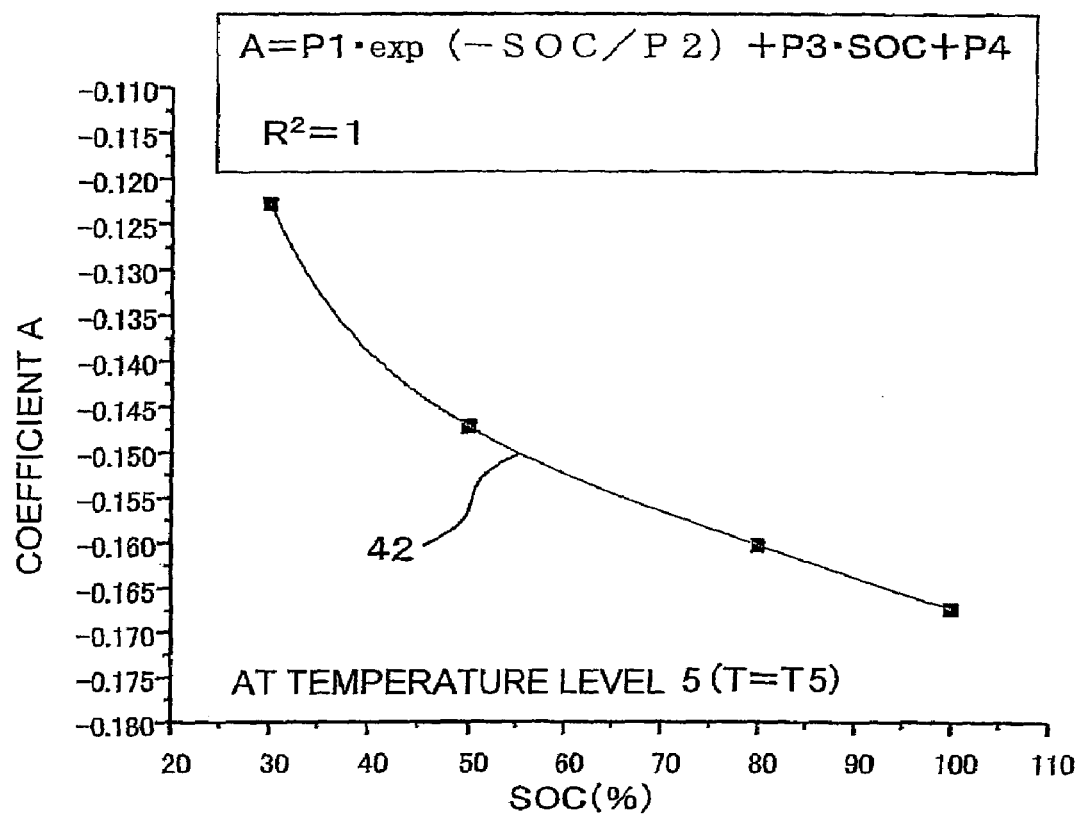
FIG. 11 is a profile showing the result of optimum fitting of a function to the SOC dependency of coefficient A (at temperature level 4)

It is required that coefficients A1 to A9 used in the above equations 11 to 14 are optimized such that the coefficient A indicates the variations as shown in FIG. 8. Firstly, FIG. 10 and FIG. 11 show the result of optimum fitting of the coefficient A at each temperature level by using the equation 10 showing dependency on SOC. FIG. 10 and FIG. 11 show fittings at temperature levels T1 and T5 respectively (reference numerals 41 and 42). The optimum values of the coefficients P1 to P4 at each temperature level are obtained by fitting the change of coefficient A against SOC at each temperature level to equation 10.

Figure 12:
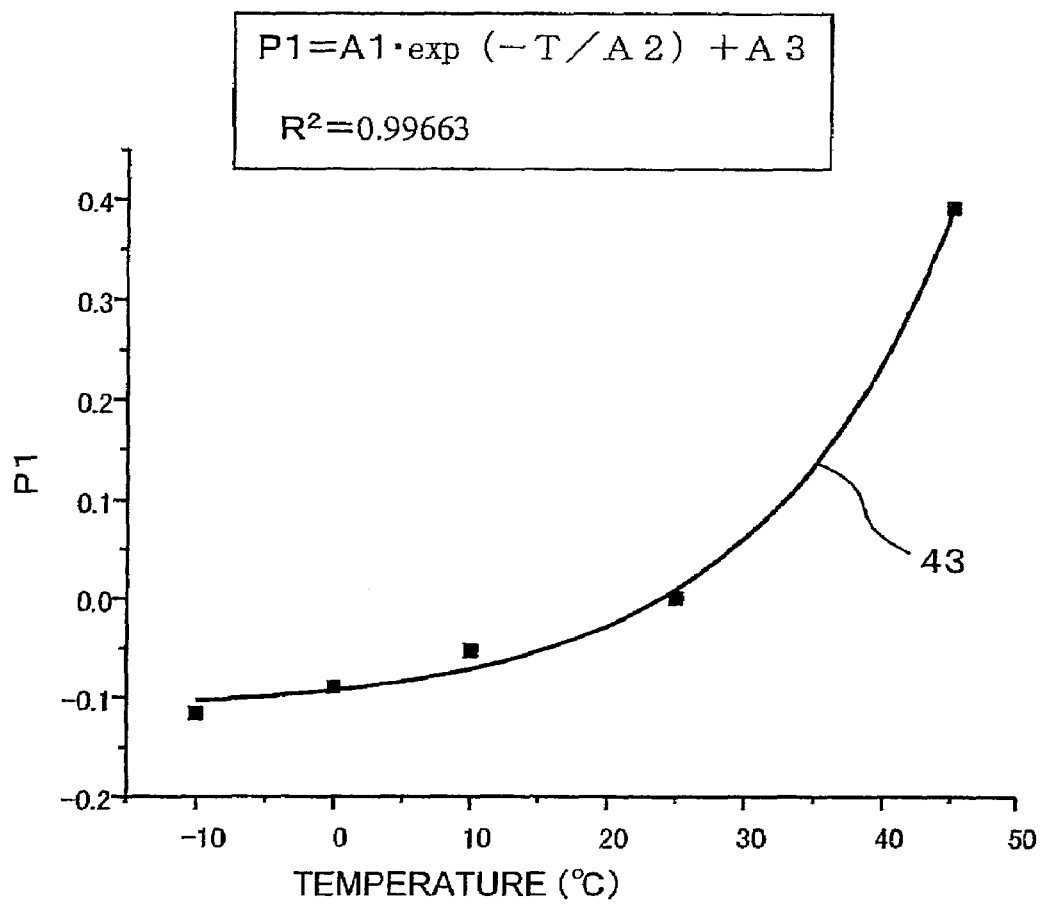
FIG. 12 is a profile showing the result of an optimum fitting of a function to the temperature T dependency of coefficient P1.

Next, the optimized values of coefficients A1 to A9 of the equation 11 to the equation 14 are obtained on the basis of the optimum values of coefficient P1 to P4 at each temperature level. Firstly, the result of the optimum value thereof fitted in optimum with the equation 11 to coefficient P1 is shown by the reference numeral 43 in FIG. 12. From the figure, it is recognizable that equation 11 can be approximated appropriately to the optimized values of P1 that changes nonlinearly.

Figure 13:
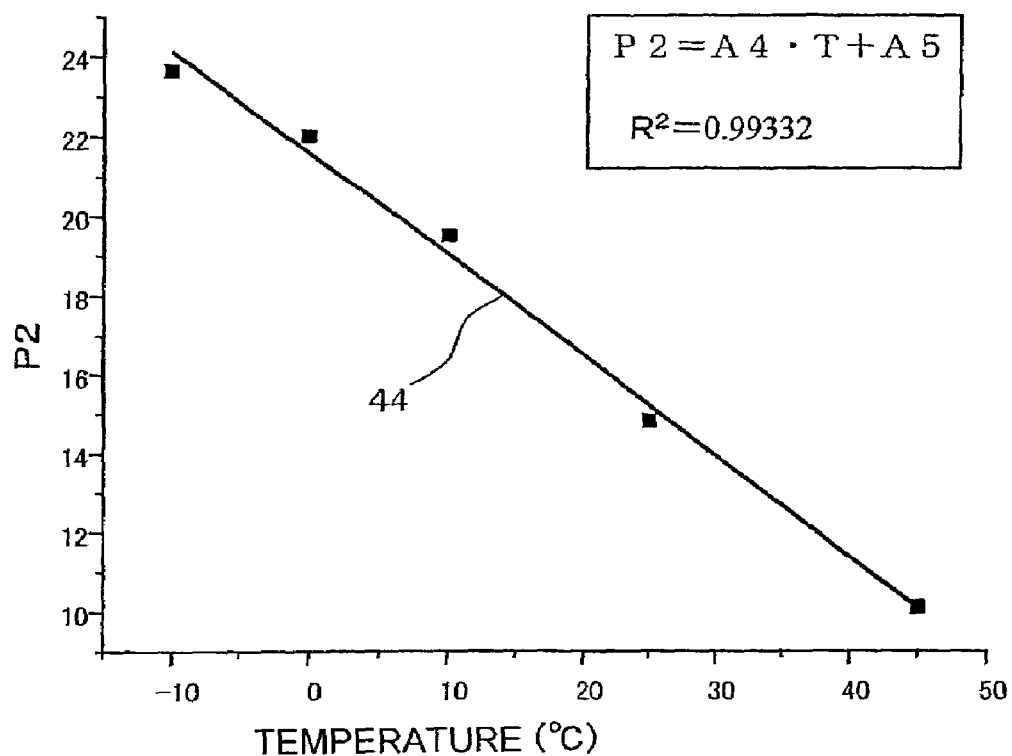
FIG. 13 is a profile showing the result of an optimum fitting of a function to the temperature T dependency of coefficient P2.
Figure 14:
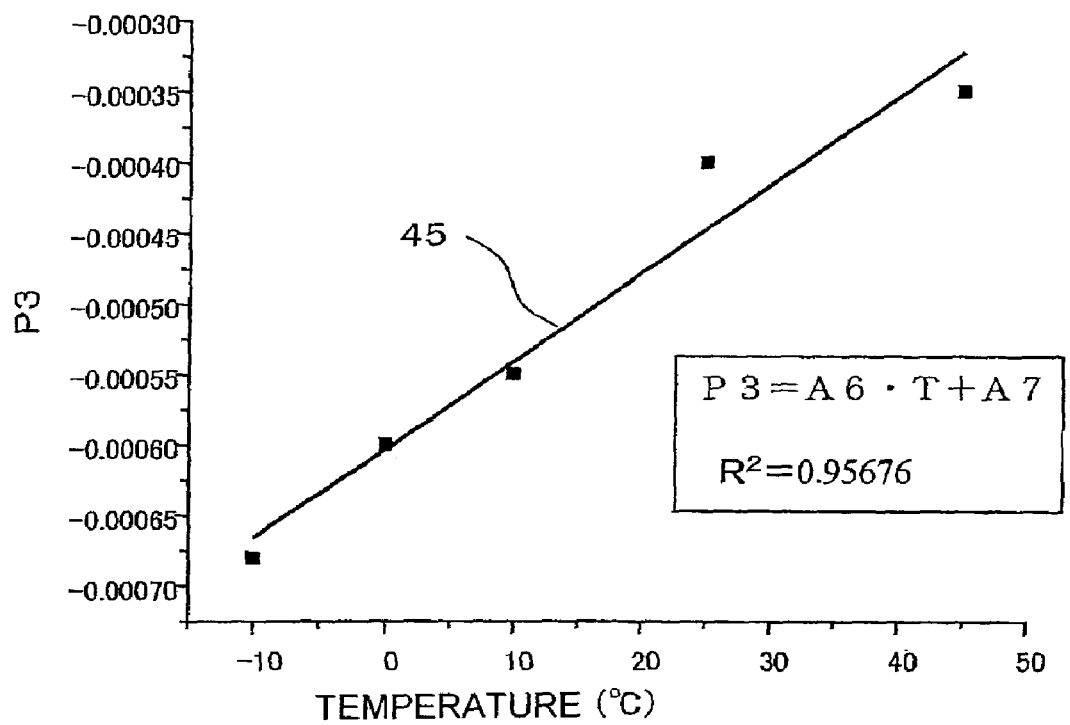
FIG. 14 is a profile showing the result of an optimum fitting of a function to the temperature T dependency of coefficient P3.
Figure 15:
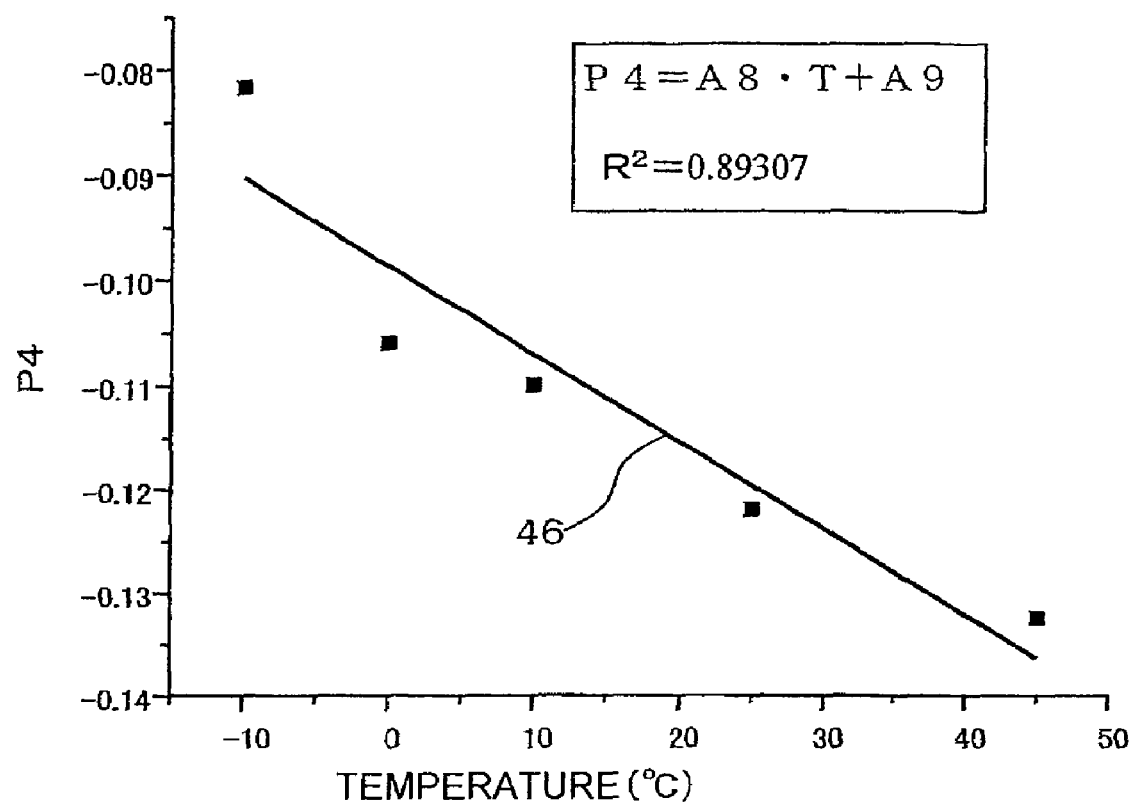
FIG. 15 at every temperature level, is a profile showing the result of an optimum fitting of a function to the temperature T dependency of coefficient P4.

Similarly, the result of the coefficients P2 to P4 fitted in optimum with the equation 12 to the equation 14 are shown by reference numerals 44 to 46 in FIG. 13 to FIG. 15 respectively. For the coefficients P2 to P4, as the approximations are given as a linear equation of the temperature T, from the figures, it can be understood that each of the coefficients is made to be a good approximation. From the above optimum approximation, the optimum values of coefficients A1 to A9 are determined, and hereby it becomes possible to determine the optimum coefficient A against the change of temperature and SOC of the battery.

Next, an example of optimizing coefficient B being a function of temperature and SOC by using the polynomial function is described in the following. The coefficient B is expressed in a linear equation of temperature T and SOC, as follows:

$$B = B1 \cdot SOC + Q \quad \text{(equation 15)}$$

$$Q = B2 \cdot T + B3 \quad \text{(equation 16)}$$

Figure 16:
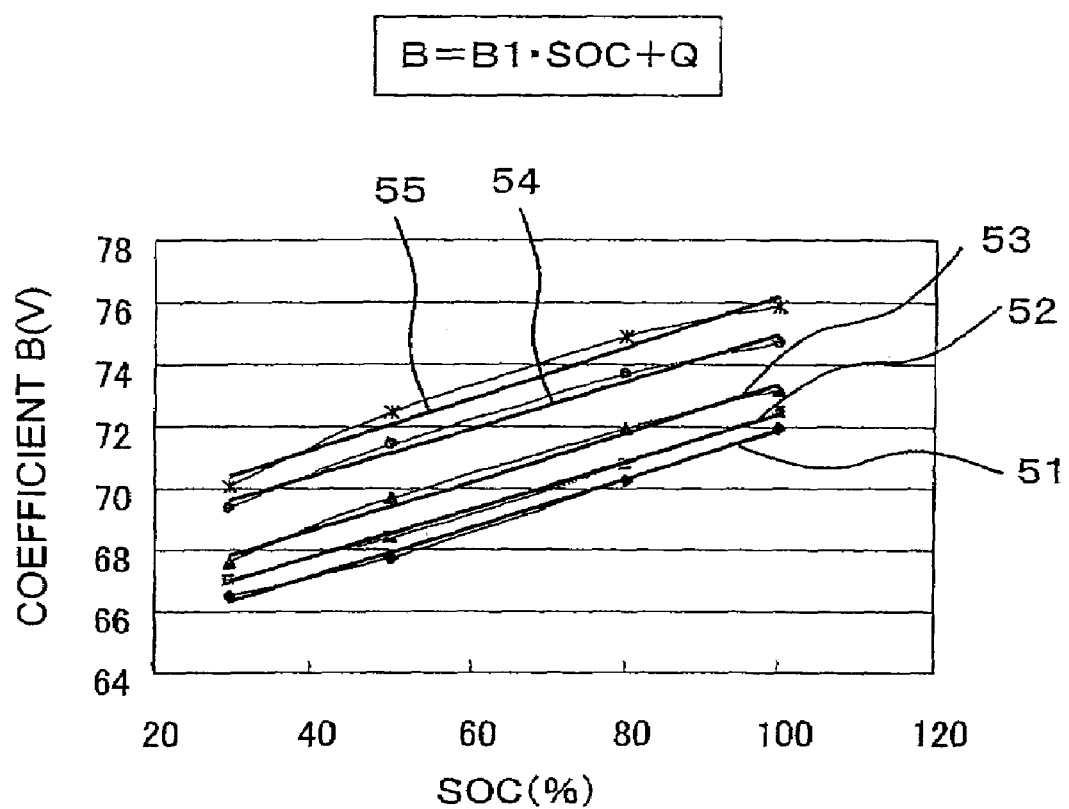
FIG. 16 is a profile showing the result of an optimum fitting of a function to the SOC dependency of coefficient B, at every temperature level.

Coefficient B1 and Q used in the above equation 15 are optimized such that coefficient B indicates the variations as shown in FIG. 9. Firstly, FIG. 16 shows the result of optimum fitting of the coefficient B1 at each temperature level by using the equation 15 showing dependency on the SOC. As being apparent from the figure, it can be understood that graph 51 to graph 55 fitting equation 15 to the change of coefficient B1 against the SOC at each temperature level show a good matching to the value of the coefficient B1.

Figure 17:
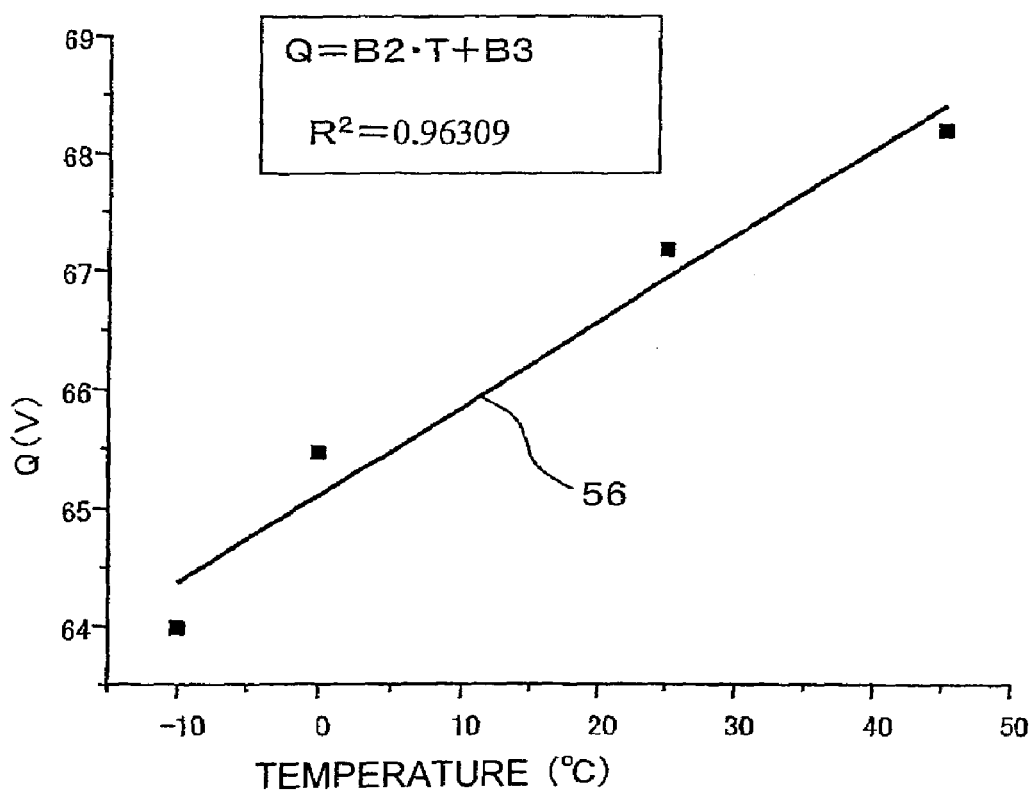
FIG. 17 is a profile showing the result of an optimum fitting of a function to the temperature T dependency of coefficient Q.

Next, the optimized values of coefficients B2 and B3 of equation 16 are obtained on the basis of optimum value of coefficient Q at each temperature level. The optimized result of fitting of equation 16 to the optimized value of the coefficient Q is shown in the reference numeral 56 in FIG. 17. From the figure, it is recognizable that equation 16 can approximate appropriately to the optimized values of coefficient Q. In the optimum approximation like this, the optimum values of the coefficients B1 to B3 are determined, and hereby it becomes possible to determine the optimum coefficient B corresponding to the change of temperature and SOC of the battery.

As explained above, in the method of the present invention for determining state of a battery, the response voltage while applying a constant current discharge is expressed with a response-voltage correlative equation including at least one of a polynomial function, an exponential function, and a reciprocal function of the internal impedance or the internal resistance of the battery, and the coefficients used in the response-voltage correlative equation are expressed with at least one of the equation of the polynomial function and the exponential function using variables of temperature and SOC of the battery. Thus, it becomes possible to determine the response voltage with high accuracy from the measured value of the internal impedance or the internal resistance even if the temperature and the SOC are changed.

Besides, the coefficients of the response-voltage correlative equation can be expressed with an equation composed of addition or accumulation of the both equations which are expressed by at least one of the polynomial function and the exponential function of the temperature and the SOC, respectively. Also, in the above exemplary embodiment, although the coefficients of the response-voltage correlative equation are expressed with a combination of the polynomial function and the exponential function, it is also possible similarly to determine the response voltage with high accuracy in the case that the reciprocal function is used.

Figure 1:
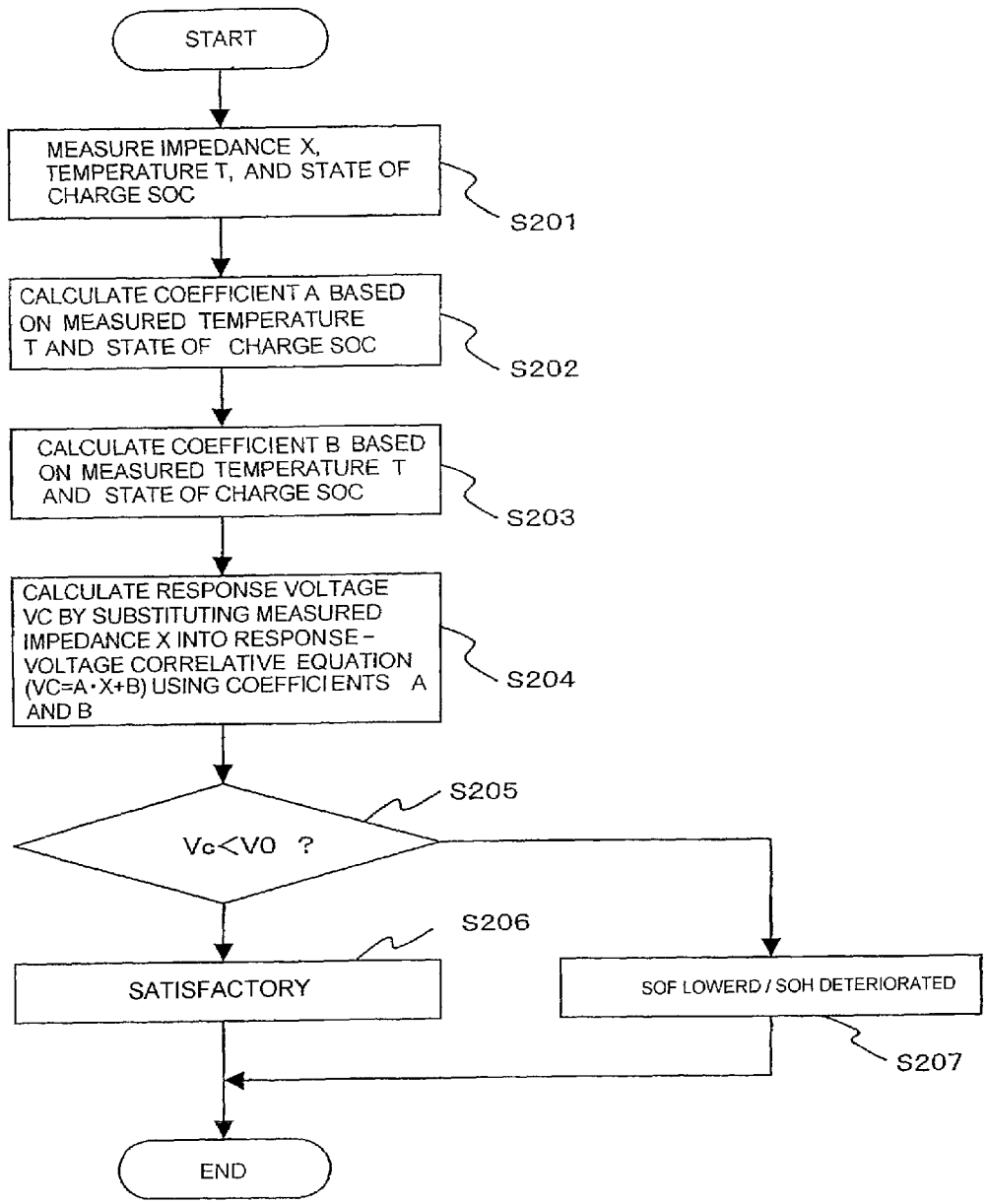
FIG. 1 is a flow chart showing a procedure for determining SOF or SOH of a battery by using a response-voltage correlative equation prepared in advance.

Next, the procedure to prepare the response-voltage correlative equation, and to determine the SOF and the SOH of the battery according to the method for determining state of a battery of the present invention is described hereunder with reference to the flow chart shown in FIG. 1. FIG. 1 shows a procedure for determining SOF and SOH of the battery by using a response-voltage correlative equation prepared in advance. First of all, the internal impedance X, the temperature T, and the state of charge SOC are measured at a predetermined timing to determine SOF and SOH of the battery (step 201).

Next, coefficient A is calculated by substituting the measured temperature T and state of charge SOC in equation 10 to equation 14 (step S202). Similarly, the coefficient B is calculated by substituting the measured temperature T and the state of charge SOC in equation 15 and equation 16 (step S203). And, the response voltage Vc is calculated by substituting the measured internal impedance X in the response-voltage correlative equation (equation 9) in which the calculated coefficients A and B are applied (step S204).

Moreover, the response voltage Vc calculated at step 204 is compared with a predetermined threshold V0 (step S205), and if Vc is higher than or equal to V0, the battery is determined as being satisfactory, thus continuing the operation (step S206). On the contrary, if Vc is lower than V0, the battery is determined as the SOF being lowered or deteriorated (step S207), and an alert output or the like is generated if needed. Hereby, it is possible for the user to carry out a treatment such as exchanging batteries, or the like, promptly.

Figure 18:
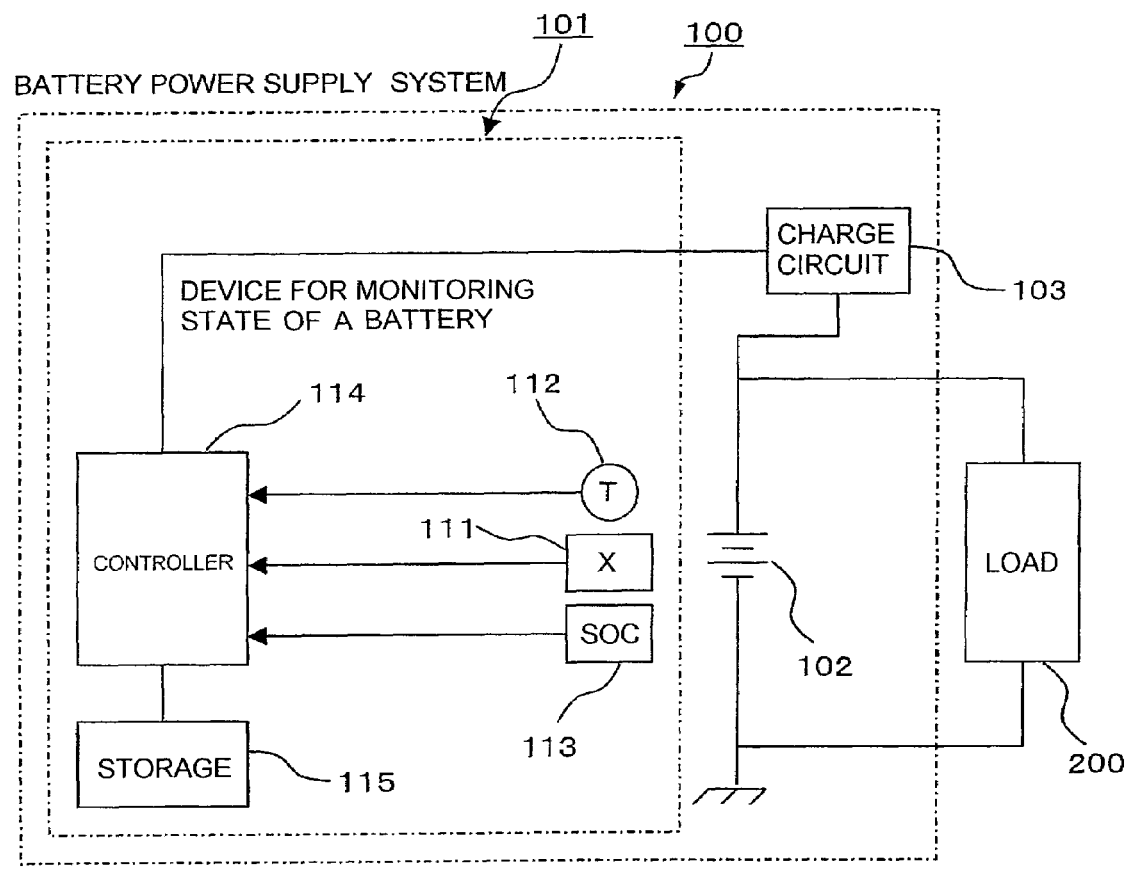
FIG. 18 is a block diagram illustrating an embodiment of a device for monitoring state of a battery and a battery power supply system of the present invention.

One embodiment of a device for monitoring state of a battery and a battery power supply system using the method of the present invention for determining state of a battery is described hereunder with reference to FIG. 18. FIG. 18 is a block diagram illustrating a schematic configuration of a battery power supply system 100 and a device 101 for monitoring state of a battery of the present invention. The battery power supply system 100 includes a device 101 for monitoring state of a battery, a battery 102, and a charge circuit 103, and is connected to a load 200.

Besides, the device 101 for monitoring state of a battery includes an internal impedance measurement unit 111 for measuring the internal impedance of the battery 102, a temperature sensor 112 for measuring the temperature of the battery 102, an SOC sensor 113 for measuring the SOC of the battery, a controller 114 for carrying out various processing to determine SOH or SOF of the battery 102, and a storage 115 for storing a response-voltage correlative equation or the like.

The processing to determine optimum values of the coefficients A and B is executed in advance according to the data that is obtained by performing a predetermined constant discharge. In the device 101 for monitoring state of a battery of the present embodiment shown in FIG. 18, the response-voltage correlative equation represented in, for example, the equation 9, and the calculation formula for calculating the coefficients A and B, and the coefficients of the equation which are determined in advance, are stored in the storage 115 in advance.

After the battery 102 is started as the power supply to the load 200, the SOH or the SOF of the battery 102 is monitored periodically or predetermined timing by the device 101 for monitoring state of a battery. That is, the device 101 for monitoring state of a battery measures the internal impedance or the internal resistance, the temperature and the SOC of the battery 102 with the use of the internal impedance measurement unit 111, the temperature sensor 112, and the SOC sensor 113 respectively at monitoring timing, and transmits the data to the controller 114.

Also, the controller 114, along with inputting the above mentioned internal impedance or internal resistance, temperature and SOC, loads the response-voltage correlative equation (equation 9), the calculation equations (equation 10 to 16) to determine the coefficients A and B, and the coefficients of the equations from the storage 115. The response voltage Vc is calculated according to the flow chart in FIG. 1, and then the SOF or the SOH of the battery 102 is determined by comparing the calculated result with the predetermined threshold V0.

As described above, in the battery power supply system 100 and the device 101 for monitoring state of a battery of the present embodiment, it becomes possible to determine the response voltage from a voltage-response correlative equation, and the SOH or the SOF of the battery with high accuracy by comparing the estimated response voltage with a predetermined threshold. As the result of the determination, if the battery is determined to be lacking in SOF, it is also possible to charge the battery 102 promptly by using the charge circuit 103.

Figure 20:
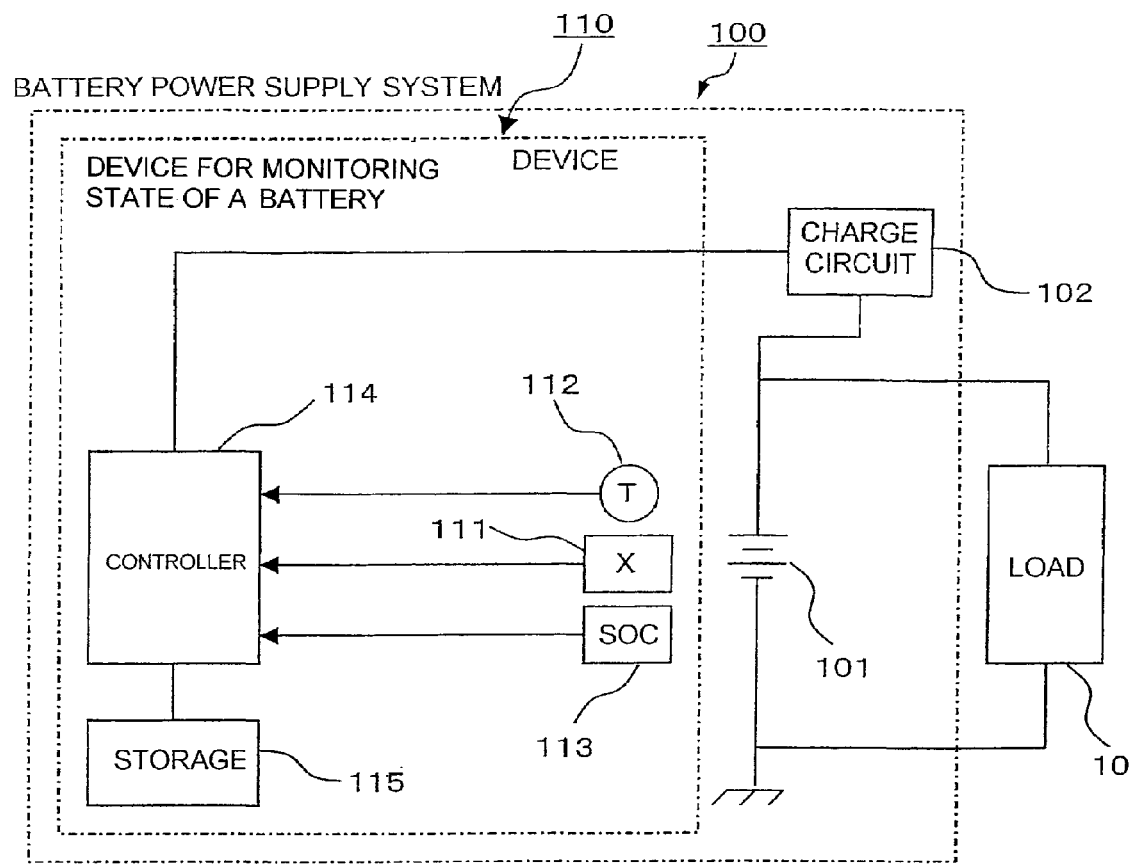
FIG. 20 is a block diagram illustrating an schematic configuration of a device for determining state of a battery and a battery power supply system of an embodiment of the present invention.

An embodiment of the schematic configuration of a device for determining state of a battery and a battery power supply system of the present invention is shown in FIG. 20. FIG. 20 is a block diagram illustrating a schematic configuration of the battery power supply system 100 and the device 101 for monitoring state of a battery of the present embodiment. The battery power supply system 100 includes a battery 101, a charge circuit 102, and a device 101 for monitoring state of a battery, and is connected to a load 10.

The device 101 for monitoring state of a battery includes an internal impedance measurement unit 111 for measuring the internal impedance of the battery 101, a temperature sensor 112 for measuring temperature, an SOC sensor 113 for measuring SOC, a controller 114 for carrying out various processing to determine SOH or SOF of the battery 101, and a storage 115 for storing various data and various measured data that is necessary for the processing of the controller 114.

The method for determining SOH or SOF of the battery 101 in the controller 114 is explained hereunder in detail. In the present embodiment, the internal resistance or the internal impedance of the battery 101 is used as an index to determine SOH or SOF of the battery 101. Since the internal resistance or the internal impedance varies corresponding to temperature and SOC of the battery 101, it is required that the internal resistance or internal impedance is obtained at the temperature and the SOC which satisfy the condition for determining SOH or SOF.

In the case where SOH is determined by using the internal resistance or the internal impedance as an index, it is required to obtain the internal resistance or the internal impedance in a predetermined standard state of the battery 101. It can be determined whether or not the battery 101 is deteriorated by comparing the obtained data with a predetermined threshold to determine SOH. Here, the internal resistance or the internal impedance in the standard state means the internal resistance or the internal impedance when the temperature and the SOC of the battery 101 are the predetermined standard temperature and the standard SOC, respectively.

Besides, in the case that SOF is determined by using the internal resistance or the internal impedance as the index, it is required to obtain the internal resistance or the internal impedance at the time when determining the SOF of the battery 101. Whether or not the SOF of the battery 101 is adequately maintained can be determined by comparing the obtained data with the predetermined threshold for SOF.

Figure 21:
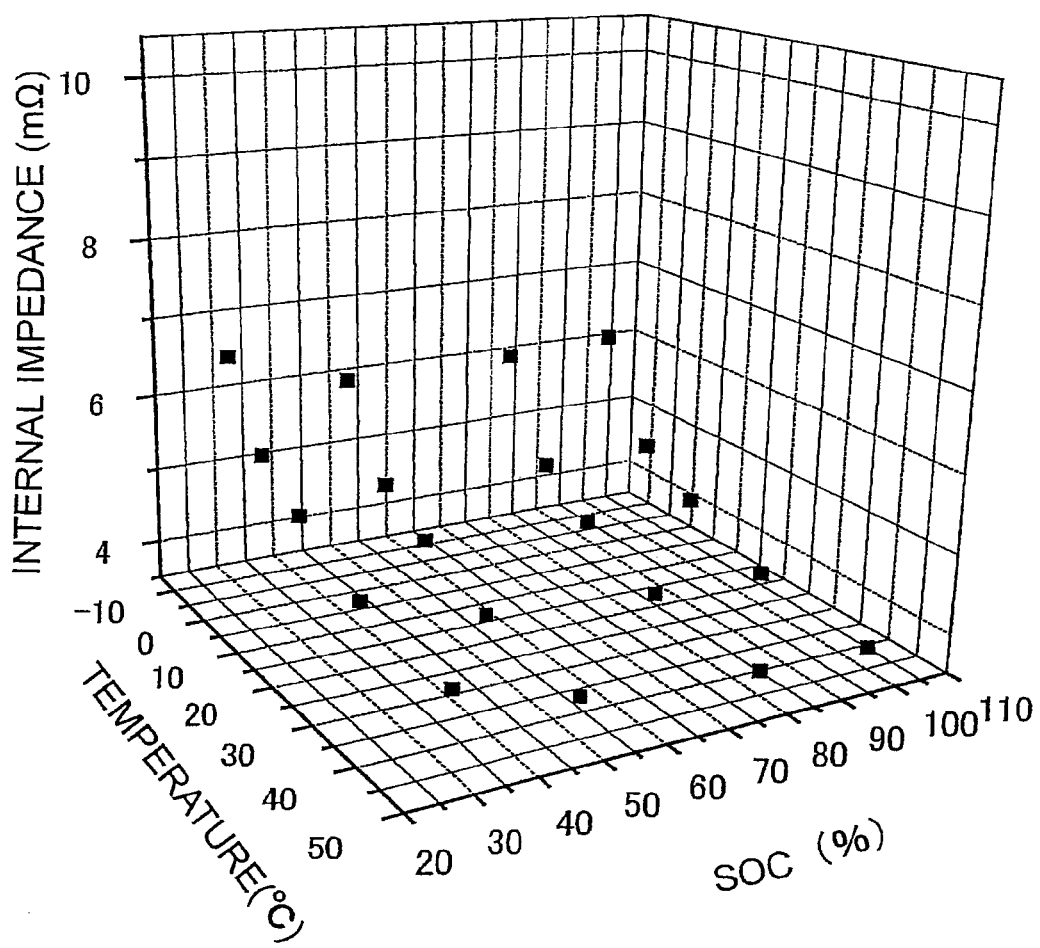
FIG. 21 is a three-dimensional profile showing the change of the internal impedance corresponding to temperature and SOC for a new battery.
Figure 22:
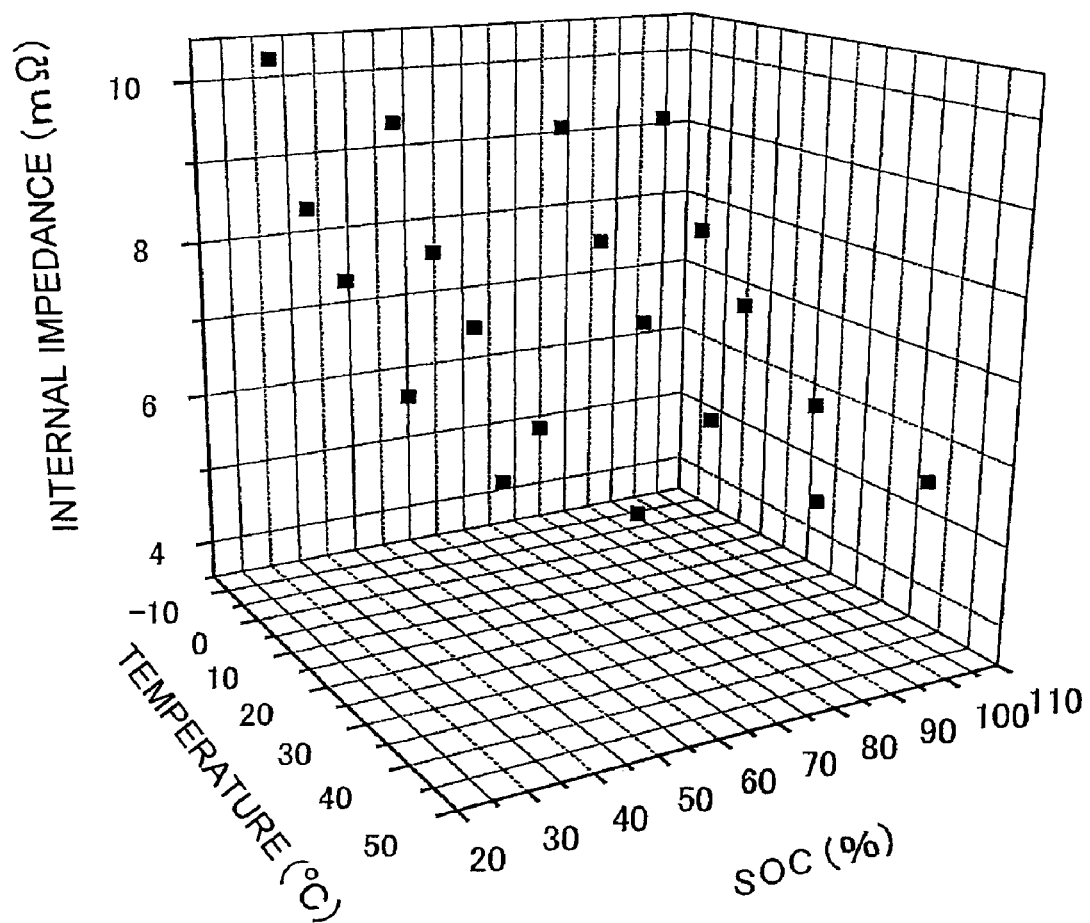
FIG. 22 is a three-dimensional profile showing the change of the internal impedance corresponding to temperature and SOC for a deteriorated battery.

As described above, in order to determine SOH or SOF of the battery 101 with high accuracy, it is necessary to estimate the internal resistance or the internal impedance at any temperature and any SOC of the battery 101. Hereunder, the method for estimating the value of the internal impedance of the battery 101 at any temperature and any SOC is explained. It is also possible to estimate the internal resistance with high accuracy similarly as follows:

As described above, the internal impedance of the battery varies with temperature and SOC, in addition, varies with SOH as well. Then, the variation of the internal impedance of a new battery without deterioration, and the variation of the internal impedance of a deteriorated battery with being used are shown in FIG. 21 and FIG. 22 respectively. Both of FIG. 21 and FIG. 22 three-dimensionally illustrate the variation of the internal impedance corresponding to temperature and SOC.

From FIG. 21 and FIG. 22, it is recognizable that the internal impedance varies rather largely with temperature. Also, it is illustrated that the internal impedance is varied along with the variation of SOC as well. In addition, it is recognizable that the internal impedance becomes larger as the deterioration of the battery advances by comparing FIG. 21 with FIG. 22. In particular, as the dependency of the internal impedance on temperature and SOC also varies along with SOH, it is recognizable that the variation of the internal impedance corresponding to temperature and SOC becomes larger as the deterioration of the battery goes ahead.

Thus, in the present embodiment, the internal impedance is expressed by the function including at least one of the polynomial function, the exponential function and the reciprocal function of temperature and SOC. The coefficients included in the functions are also expressed by functions of one specified parameter (hereinafter referred to as "C"). The variation of the dependency on temperature and SOC caused by the deterioration of the battery 101, described above, can be adjusted by the parameter C.

More specifically, the internal impedance is expressed by the first function including at least one of the polynomial function, the exponential function and the reciprocal function of temperature. At least one coefficient of the first function is expressed by the second function including at least one of the polynomial function, the exponential function and the reciprocal function of SOC. In addition, the coefficients of the first function and the second function are expressed may by functions of the parameter C.

Alternatively, the internal impedance is expressed by the third function including at least one of the polynomial function, the exponential function and the reciprocal function of SOC. At least one coefficient of the third function is expressed by the forth function including at least one of the polynomial function, the exponential function and the reciprocal function of temperature. In addition, the coefficients of the third function and the fourth function may be expressed by functions of parameter C.

In the following, as an example, the formula to calculate the internal impedance is explained when the internal impedance is expressed by the first function including at least one of the polynomial function, the exponential function and the reciprocal function of temperature. In the case where the internal impedance is represented by Z and temperature is represented by T, an example, in which the internal impedance Z is expressed by the polynomial function of temperature T, is expressed as follows:

$$Z = AC0 + AC1 \cdot T + AC2 \cdot T^2 + AC3 \cdot T^3 \quad \text{(equation 17)}$$

Here, AC0, AC1, AC2, and AC3 represent the coefficients of each term.

Figure 23:
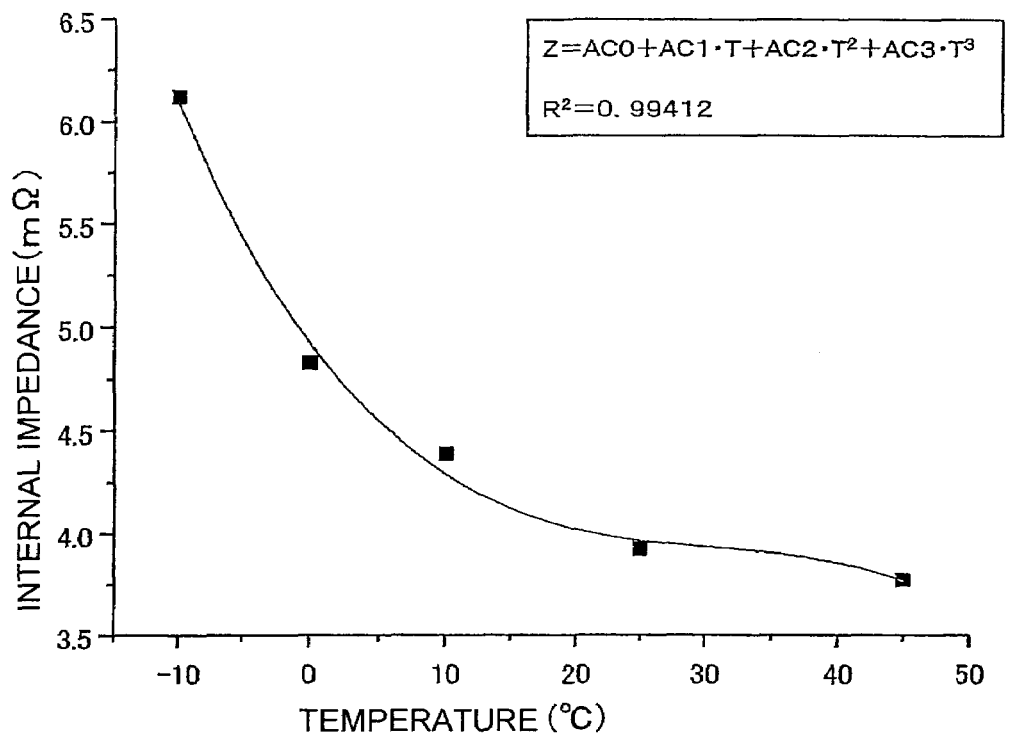
FIG. 23 is a profile showing the result of the internal impedance of the new battery fitted with the polynomial function.

An example of implementing the fitting of equation 17 to the internal impedance of the new battery 101 shown in FIG. 21 is shown in FIG. 23. As shown in FIG. 23, it is recognizable that the internal impedance Z is accurately approximated with the third degree polynomial function of temperature T.

In addition, an example, in which the internal impedance Z is expressed with the equation including the reciprocal function of temperature T, is shown as follows:

$$Z = 1/(AH1 \cdot T + AH2) + AR3 \quad \text{(equation 18)}$$

Figure 24:
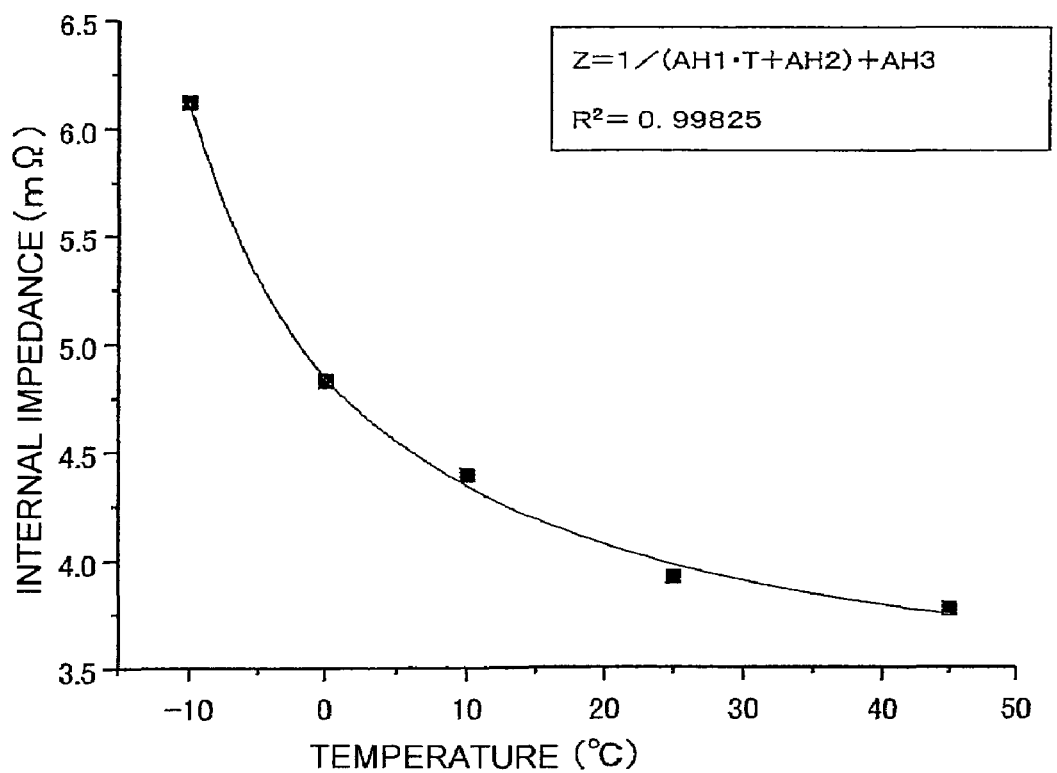
FIG. 24 is a profile showing the result of the internal impedance of the new battery fitted with the reciprocal function.

Here, AH1, AH2, and AH3 represent the coefficients of each term. An example of implementing the fitting of equation 18 to the internal impedance of the same new battery 101 is shown in FIG. 24. As shown in FIG. 24, it is understandable that the reciprocal function also is able to approximate the internal impedance Z accurately as the function of temperature T.

Besides, an example, in which the internal impedance Z is expressed with the equation including the exponential function of temperature T is shown as follows:

$$Z = AE1 \cdot \exp(-T/AE2) + AE3 \quad \text{(equation 19)}$$

Figure 25:
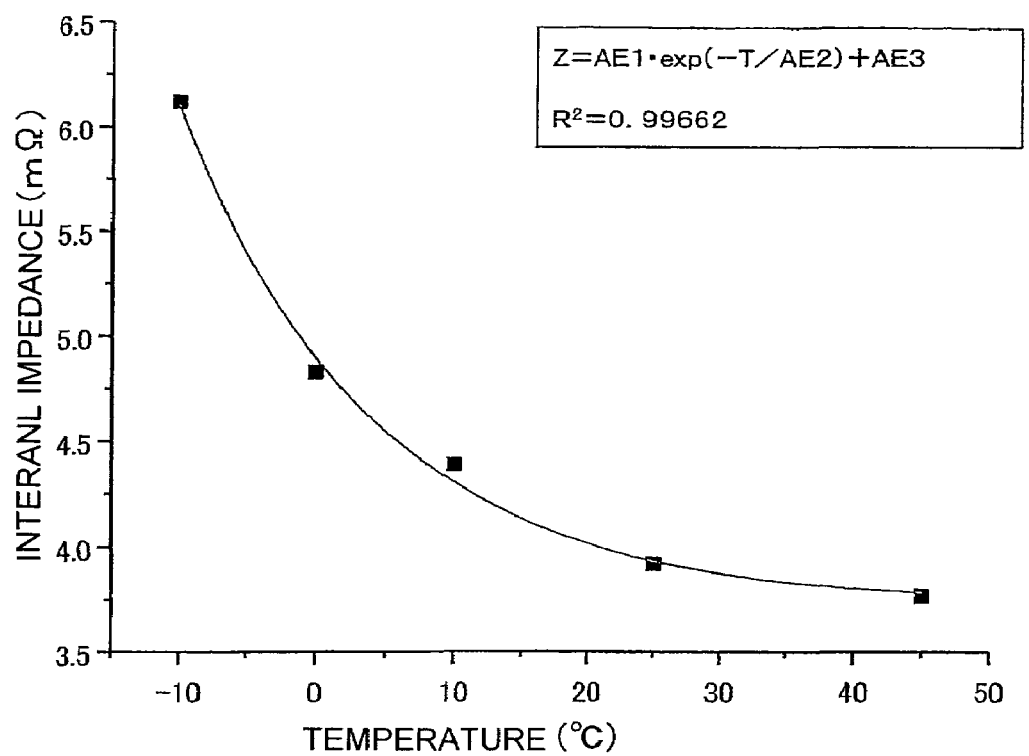
FIG. 25 is a profile showing the result of the internal impedance of the new battery fitted with the exponential function.

Here, AE1, AE2, and AE3 represent the coefficients of each term. An example of implementing the fitting of equation 19 to the internal impedance of the same new battery 101 is shown in FIG. 25. As shown in FIG. 25, it is recognizable that exponential function also is able to approximate the internal impedance Z accurately as the function of temperature T.

In the present embodiment, coefficients AC0 to AC3, or AH1 to AH3, or AE1 to AE3 included in the above equation 17 to equation 19 are expressed further by using the second function including at least one of the polynomial function, the exponential function and the reciprocal function of SOC.

Hereunder, a method for determining the coefficients AE1 to AE3 is explained as a case of applying, as an example, the exponential function (equation 3). Although the coefficients AE1 to AE3 are to be expressed with the second functions including at least one of the polynomial function, the exponential function and the reciprocal function of SOC, for simplicity purpose, only the coefficient AE3 is expressed with any of the above functions.

When representing SOC as S, an example, in which the coefficient AE3 is expressed with the polynomial function of SOC S, is shown as follows:

$$AE3 = BC0 + BC1 \cdot S + BC2 \cdot S^2 + BC3 \cdot S^3 \quad \text{(equation 20)}$$

Here, BC0, BC1, BC2, and BC3 represent the coefficients of each term.

Figure 26:
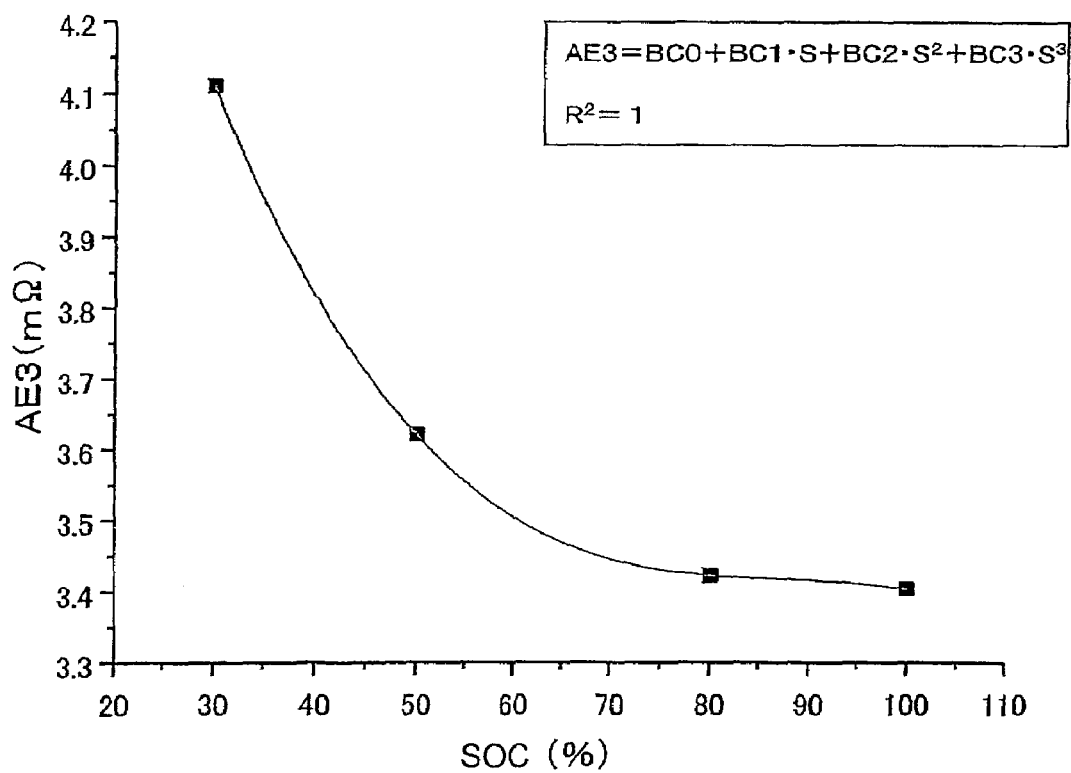
FIG. 26 is a profile showing the result of the coefficient AE3 fitted with the polynomial function.

An example of fitting of equation 20 to the coefficient AE3 is shown in FIG. 26. As shown in FIG. 26, it is recognizable that the third degree polynomial function of SOC S is able to approximate the coefficient AE3 highly accurately.

Also, an example of expressing the coefficient AE3 by the reciprocal function of SOC S is shown as follows:

$$AE3 = 1/(BH1 \cdot S + BH2) + BH3 \quad \text{(equation 21)}$$

Figure 27:
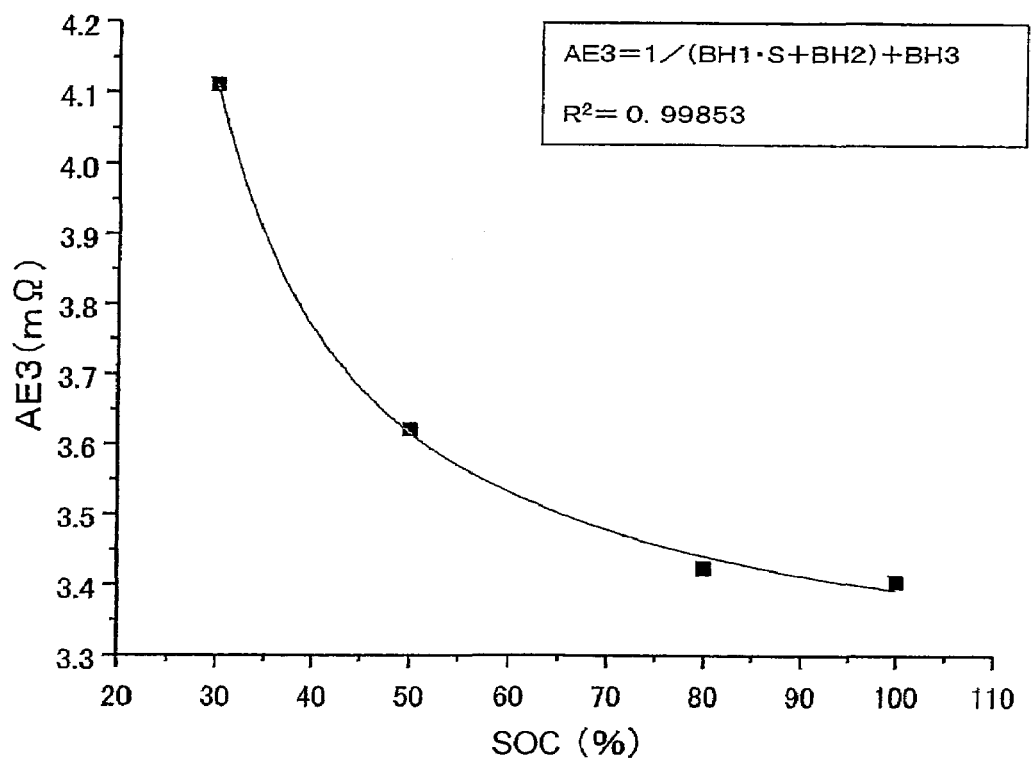
FIG. 27 is a profile showing the result of the coefficient AE3 fitted with the reciprocal function.

Here, BH1, BH2, and BH3 represent the coefficients of each term. An example of fitting of equation 21 to the coefficient AE3 is shown in FIG. 27. It is recognizable that the reciprocal function of SOC S is able to approximate the coefficient AE3 highly accurately as shown in FIG. 27.

Further, an example of expressing the coefficient AE3 with the exponential function of SOC S is shown as follows:

$$AE3 = BE1 \exp(-S/BE2) + BE3 \quad \text{(equation 22)}$$

Here, BE1, BE2, and BE3 represent the coefficients of each term.

Figure 28:
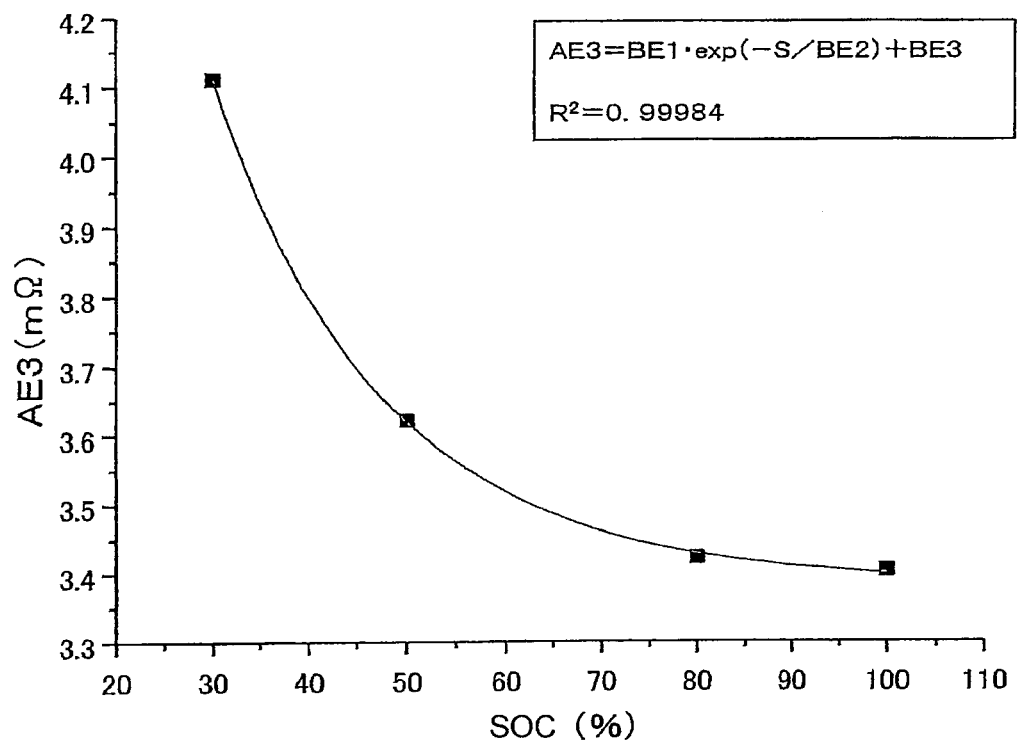
FIG. 28 is a table showing the result of the coefficient AE3 fitted with the exponential function.

An example of fitting of equation 22 to the coefficient AE3 is shown in FIG. 28. As shown in FIG. 28, It is recognizable that the exponential function of SOC S is able to approximate the coefficient AE3 highly accurately.

Further, in the present embodiment, at least one of the coefficients included in the above equation 17 to equation 22 is expressed with the function of one specified parameter C. Here, as an example, a calculation formula is explained with equation 19, and coefficient AE3, that is one of the coefficients of equation 19, is expressed with equation 22. Also, for simplicity purpose, only the coefficients AE1 and AE2 included in the equation 19 are expressed by the functions of the specified parameter C. Further, linear functions are used as the functions of C.

As explained above, the internal impedance Z is expressed with equation 19 and equation 22 when the coefficients AE1 and AE2 are expressed with linear functions of the specified parameter C.

$$Z = (CE1 + CE2 \cdot C) \cdot \exp\{-T/(CE3 + CE4 \cdot C)\} + BE1 \cdot \exp(-S/BE2) + BE3 \quad \text{(equation 23)}$$

In the equation 7, $AE1 = CE1 + CE2 \cdot C$ and $AE2 = CE3 + CE4 \cdot C$ Here, CE1, CE2, CE3, CE4, BE1, BE2, and BE3 are predetermined constants.

In the battery state determining device 110 of the present embodiment, the controller 114 calculates the internal impedance at the predetermined temperature and SOC of the battery 101, by using, for example, the equation 23. In order to use the equation 23, the value of the specified parameter C needs to be determined. So, the controller 114 inputs each of the simultaneously measured internal impedance, temperature, and SOC from the internal impedance measurement unit 111, the temperature sensor 112, and the SOC sensor 113 respectively at the predetermined timing, and calculates the value of the specified parameter C by substituting these values in the equation 23.

In this way, it becomes possible to highly accurately estimate the internal impedance corresponding to the latest state of the battery 101 by correcting the specified parameter C included in the calculation formula of the internal impedance by using the measured data. Therefore, it becomes possible that the internal impedance at the respective predetermined temperature and SOC is estimated with high accuracy by using the calculation formula of the internal impedance even if the characteristic of the internal impedance of the battery 101 has been changed because of deterioration caused by ageing or the like.

As the equation 23 is the nonlinear function, it is impossible to obtain an analytic solution, but, the value of the specified parameter C can be obtained by performing a iterating operation by using, for example, Newton method or the like. By substituting the specified parameter C calculated in this way in the equation 23, the equation 23 becomes a final calculation formula of the internal impedance Z using variables of only temperature T and SOC S. By substituting the predetermined temperature T and SOC S in the right-hand side of the final calculation formula, it becomes possible to obtain the internal impedance Z of the battery 101 at that time.

In order to check the accuracy of the internal impedance calculation formula obtained in the above, the internal impedance of the battery 101 is measured at some typical temperature and SOC conditions, and a final calculation formula is determined by determining the specified parameter C, the internal impedance is estimated at the respective predetermined standard temperature and standard SOC by using the final internal impedance calculation formula. The result thereof is shown in FIG. 29. FIG. 29($a$) shows the result of estimating the internal impedance of the new battery, while FIG. 29($b$) shows the result of the deteriorated battery In FIG. 29, five points from the temperature range of −10 degrees C. to 45 degrees C. are selected, and at the same time, four points from the SOC range of 100% to 30% are selected. The internal impedance at the respective temperatures and SOC are measured, the-result thereof is shown in the upper stage of each column. Then, the value of the parameter C is determined according to each measured value of the temperature, the SOC, and the internal impedance to deduce the final internal impedance calculation formula.

Besides, the standard temperature is defined as 25 degrees C., and the standard SOC is defined as 100%, and then, the internal impedance is estimated at the above standard temperature and standard SOC, using the final calculation formula deduced on the basis of the above each measured value of temperature, SOC, and internal impedance. The result thereof is shown in the lower stage of each column.

The measured internal impedance and the estimated internal impedance at the standard temperature and standard SOC are identical, as a matter of course. Also, even in the case that the final calculation formula which is deduced at the respective measured temperatures and SOCs other than 25 degrees C. and 100% is used, it is recognizable that the internal impedance at the standard temperature and standard SOC is estimated with high accuracy. Hereby, it is understandable that the internal impedance at the respective any temperature and SOC can be estimated by the method for estimating the internal impedance, used in the present embodiment.

In the case that the SOH of the battery 101 is determined by the controller 114, the internal impedance Z at the standard temperature and the standard SOC is calculated by substituting the standard temperature and the standard SOC for the temperature T and the SOC S on the right-hand side of the final calculation formula for the impedance Z. The SOH determination threshold corresponding to the internal impedance at the standard temperature and the standard SOC is stored in, for example, the storage 115 in advance, and the controller 114 loads the SOH determination threshold from the storage 115 to compare the above calculated internal impedance Z with the SOH determination threshold. Hereby, if the calculated internal impedance is larger than the SOH determination threshold, it is possible to determine that the battery 101 is deteriorated.

Likewise, in the case where the controller 114 determines the SOF of the battery 101, the internal impedance Z at the time when the SOF is determined is calculated by substituting the temperature and the SOC at the time when the SOF is measured for the temperature T and the SOC S on the right-hand side of the final calculation formula. The threshold corresponding to the internal impedance for determining the SOF (hereinafter referred to as "SOF determination threshold") is stored in, for example, the storage 115 in advance, and then the controller 114 loads the SOF determining threshold from the storage 115 to compare the above calculated internal impedance Z with the SOF determining threshold. Hereby, if the calculated internal impedance is larger than the SOF determination threshold, it is possible to determine that the SOF of the battery 101 is lowered.

Figure 19:
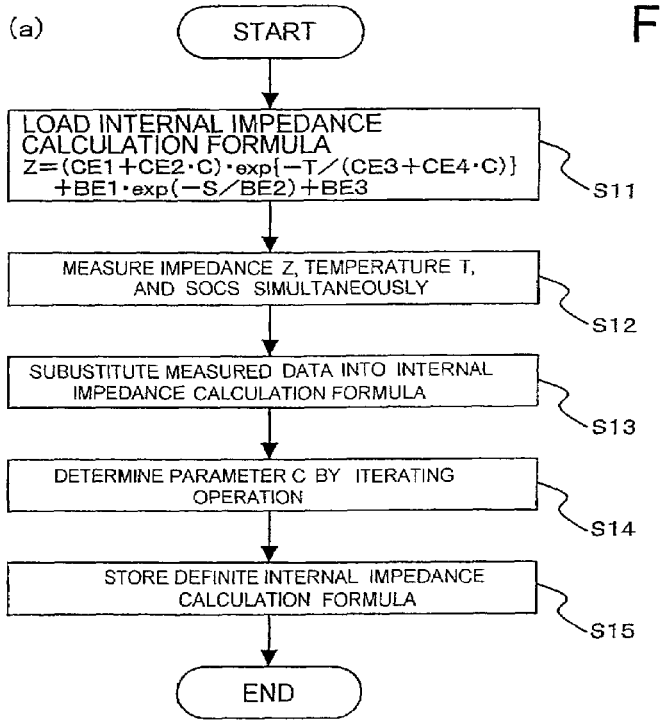
FIG. 19 is a flow chart explaining a method for determining state of a battery in an embodiment of the present invention.
Figure 19:
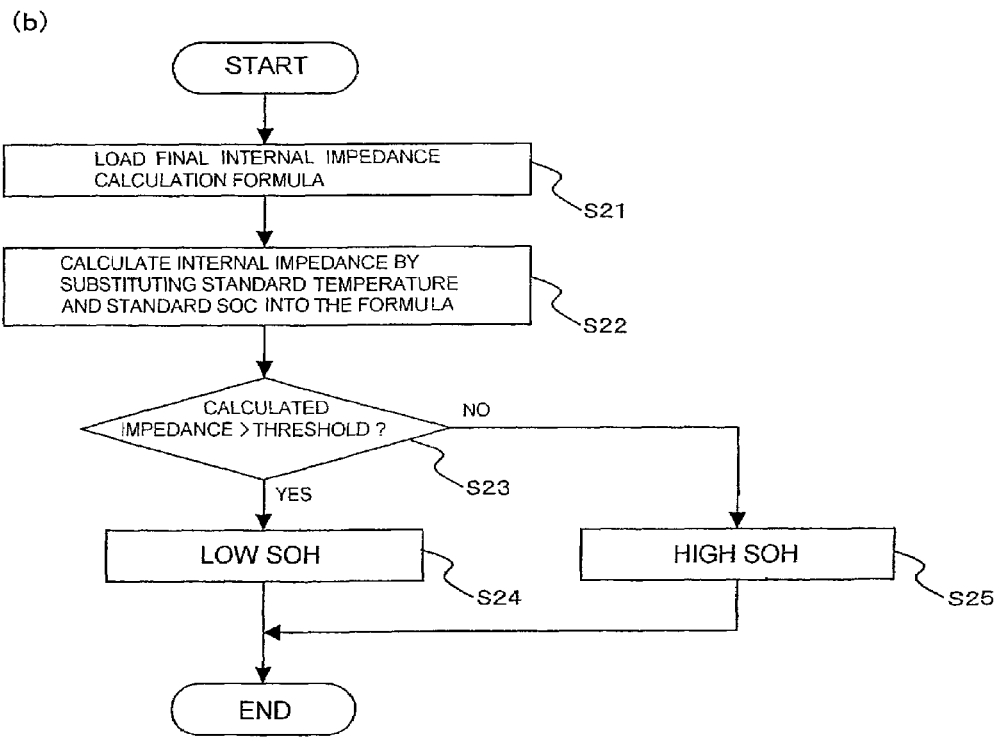

The method for determining state of a battery of the present invention is further explained with reference to the flow chart shown in FIG. 19. Also, although the explanation is made using the internal impedance as an example, it is possible to be processed likewise when the internal resistance is used. FIG. 19($a$) shows a process flow determining the final internal impedance calculation formula by calculating the specified parameter C based on the measured data of the battery 101, and FIG. 19($b$) shows a process flow determining SOH of the battery 101. Also, the determination of SOF in the battery 101 can be achieved by the similar process flow of FIG. 19($b$).

In the process flow determining the final internal impedance calculation formula of FIG. 19($a$), firstly, the internal impedance calculation formula is loaded from the storage 115 at step S11. For example, equation 7 can be used as the internal impedance calculation formula.

Next, at step 12, by simultaneously measuring the internal impedance, temperature, and SOC of the battery 101 with the internal impedance measurement unit 111, the temperature sensor 112, and the SOC sensor 113, respectively, each measured value is input to the controller 114. And, each measured value being input is substituted in the internal impedance calculation formula at step S13. Hereby, one equation using variable of only specified parameter C is obtained.

At step 14, the value of the parameter C is obtained by carrying out an iterating operation for the equation using variable of only specified parameter C obtained at step 13. For example, Newton method is usable as the iterating operation. At step 15, a final internal impedance calculation formula is obtained by substituting the value of the specified parameter C obtained hereby into the internal impedance calculation formula, and then the formula is stored in the storage 115.

Next, in the process flow determining the SOH of the battery 101 of FIG. 19($b$), firstly, the final internal impedance calculation formula is loaded from the storage 115 at step 21. And, at next step S22, the internal impedance for determining SOH is calculated by substituting the standard temperature and the standard SOC into the final internal impedance calculation formula.

At step 23, the internal impedance calculated at step 22 is compared with the SOH determination threshold. When the internal impedance is larger than or equal to the SOH determination threshold, the SOH of the battery 101 is determined to be lowered at step S24. In this case, for example, an alert may be displayed. On the contrary, when the internal impedance is smaller than the SOH determination threshold at the comparison of the step S23, the SOH of the battery S25 is determined to be high at step S25.

As explained above, according to the present invention, since the effect to the internal impedance or the internal resistance caused by the variation of temperature and SOC of the battery is corrected by the calculation formula including at least one of the polynomial function, the exponential function, and the reciprocal function, it is possible to estimate the internal resistance or the internal impedance with high accuracy at any temperature and any SOC. Hereby, it becomes possible to determine SOH or SOF of the battery with high accuracy by using the estimated internal resistance or the estimated internal impedance.

The present invention can provide a method for determining state of a battery so as to determine SOF or SOH of a battery with high accuracy by correcting the effect caused by the variation of temperature and SOC of a battery, since the coefficients of a correlation function between the response voltage at a constant current discharge and the internal impedance or the internal resistance can be calculated with high accuracy with the function of temperature and SOC of the battery.

Beside, the calculation formula of the internal resistance or the internal impedance has an adjustment parameter to be matched to measured data, thus, the internal resistance or the internal impedance can be estimated with high accuracy by correcting the adjustment parameter even if there exists deterioration caused by aging or the like.

Also, the description of the present embodiment expresses examples of a method, and a device for determining state of a battery and a battery power supply system of the present invention, and not limited thereto. Detail configuration, detail operation, and others such as the method of the present embodiment for determining state of a battery may be changed as needed without departing from the sprit and scope of the present invention.

What is claimed is:

1. A method for determining state of a battery by estimating response voltage when a predetermined discharge current pattern is applied, to determine SOF (State Of Function) or SOH (State Of Health) of a battery, comprising the steps of:

preparing in advance a prescribed correlative equation, a plurality of coefficients of which are given by functions of the temperature and the SOC (State Of Charge) of the battery, which calculates the response voltage when the predetermined discharge current pattern is applied, by using the measured value of either the internal impedance or the internal resistance of the battery;

determining the values of the coefficients by measuring the temperature and the SOC of the battery;

substituting the measured value of either the internal impedance or the internal resistance in the correlative equation with the values of the coefficients incorporated to calculate the response voltage when the predetermined discharge current pattern is applied; and determining the SOF and the SOH of the battery based on the response voltage thus calculated.

2. The method according to claim 1, wherein the correlative equation is expressed in at least one of a polynomial function, an exponential function, and a reciprocal function.

3. The method according to claim 1, wherein the coefficients of the correlative equation are expressed in at least one of a polynomial function, an exponential function, and a reciprocal function of the temperature and the SOC.

4. The method according to claim 1, wherein the coefficients of the correlative equation are expressed in functions of the temperature, and the coefficients of the functions of the temperature are expressed in functions of the SOC.

5. The method according to claim 4, wherein the functions of the temperature or the functions of the SOC comprise at least one of a polynomial function, an exponential function, and a reciprocal function.

6. The method according to claim 1, wherein the coefficients of the correlative equation are expressed in functions of the SOC, and the coefficients of the functions of the SOC are expressed in functions of the temperature.

7. The method according to claim 6, wherein the functions of the SOC or the function of the temperature comprise at least one of a polynomial function, an exponential function, and a reciprocal function.

8. A device for monitoring state of a battery, the device comprising:
an internal impedance measurement unit configured to measure either internal impedance or internal resistance of a battery;
a temperature sensor configured to measure temperature of the battery;
an SOC sensor configured to measure SOC of the battery; and
a controller in which a prescribed correlative equation is memorized in advance, a plurality of coefficients of which are given by functions of temperature and SOC (State Of Charge) of the battery, which calculates the response voltage when a predetermined discharge current pattern is applied, by using a measured value of either internal impedance or internal resistance of the battery, the values of the coefficients is determined by measuring the temperature and the SOC of the battery, the measured value of either the internal impedance or the internal resistance is substituted in the correlative equation with the values of the coefficients incorporated to calculate the response voltage when the predetermined discharge current pattern is applied, and the SOF and the SOH of the battery are determined based on the response voltage value thus calculated.

9. A battery power supply system including the battery and the device for monitoring a battery state according to claim 8.

10. A method for determining a battery state, comprising the steps of:
preparing in advance a calculation formula to calculate internal resistance or internal impedance of a battery expressed by a predetermined function including at least one of a polynomial function, an exponential function, and a reciprocal function of temperature and SOC, a plurality of coefficients thereof being functions of one specified parameter;
obtaining respective measured values by simultaneously measuring one of the internal resistance and the internal impedance, as well as the temperature and the SOC of the battery;
calculating the specified parameter value by substituting the respective measured values into the calculation formula;
determining the coefficients from the calculated specified parameter value;
substituting the predetermined temperature and the predetermined SOC in a complete calculation formula using determined coefficients to estimate either the internal resistance or the internal impedance; and
applying either the estimated internal resistance or the estimated internal impedance as an index to determine the SOH of the battery.

11. The method according to claim 10, wherein as the predetermined temperature and the predetermined SOC, a standard temperature and a standard SOC for determining the SOH of the battery are used.

12. The method according to claim 10, wherein the temperature and the SOC at a time when the SOF of the battery is determined are used as the predetermined temperature and the predetermined SOC.

13. The method according to claim 10, wherein the calculation formula for calculating either the internal resistance or the internal impedance is expressed by first function including at least one of a polynomial function, an exponential function, and a reciprocal function of the temperature, and at the same time at least one of the coefficients of the first function is expressed by second function including at least one of a polynomial function, an exponential function, and a reciprocal function of the SOC, and further a plurality of coefficients of the first function and the second function are expressed by functions of the specified parameter.

14. The method according to claim 10, wherein the calculation formula for calculating either the internal resistance or the internal impedance is expressed by second function including at least one of a polynomial function, an exponential function, and reciprocal function of the SOC, and at the same time at least one coefficient of the second function is expressed by third function including at least one of a polynomial function, an exponential function, and a reciprocal function of the temperature, and further a plurality of coefficients of the second function and the third function are expressed by functions of the specified parameter.

15. A device for determining state of a battery by estimating either internal resistance or internal impedance of a battery at the predetermined temperature and the predetermined SOC, and applying either the estimated internal resistance or the estimated internal impedance as an index to determine the state of a battery, the device comprising:
an internal impedance measurement unit configured to measure either an internal impedance or an internal resistance of a battery;
a temperature sensor configured to measure the temperature of the battery;
an SOC sensor configured to measure the SOC of the battery; and
a controller configured to prepare in advance and store a calculation formula for calculating either the internal resistance or the internal impedance expressed by a function including at least one of a polynomial function, an exponential function, and a reciprocal function of the temperature and the SOC with a plurality of coefficients thereof expressed by functions of one specified parameter, input respective measured values of either the internal resistance or the internal impedance, as well as the temperature and the SOC which are simultaneously measured by the internal impedance measurement unit, the temperature sensor and the SOC sensor, substitute the measured values of either the internal resistance or the internal impedance, as well as the temperature and the SOC in the calculation formula to calculate the specified parameter, and substitute the predetermined temperature and the predetermined SOC in a complete calculation formula using the coefficients determined from the calculated specified parameter to estimate either the internal resistance or the internal impedance.

16. The device according to claim 15, wherein the controller, using a standard temperature and a standard SOC as the predetermined temperature and the predetermined SOC for determining the SOH of the battery, is configured to substitute the standard temperature and the standard SOC in the complete calculation formula to estimate either the internal resistance or the internal impedance, and apply either the estimated internal resistance or the estimated internal impedance as an index to determine the SOH of the battery.

17. The device according to claim 15, wherein the controller, using the temperature and the SOC at the time when the SOF of the battery is measured as the predetermined temperature and the predetermined SOC, is configured to substitute the temperature and the SOC at the time when SOF of the battery is measured in the complete calculation formula to estimate the internal resistance or the internal impedance, and apply the estimated internal resistance or the internal impedance as an index to determine the SOF of the battery.

18. The device according to claim 15, wherein the controller is configured to use a calculation formula for calculating either the internal resistance or the internal impedance expressed by first function including at least one of a polynomial function, an exponential function, and a reciprocal function of the temperature, and at least one of a plurality of coefficients of the first function is expressed by second function including at least one of a polynomial function, an exponential function, and a reciprocal function of the SOC, and further a plurality of coefficients of the first function and the second function are expressed by functions of the specified parameter.

19. The device according to claim 15, wherein the controller configured to use a calculation formula calculating either the internal resistance or the internal impedance expressed by second function including at least one of a polynomial function, an exponential function, and a reciprocal function of the SOC, and at least one of a plurality of coefficients of the second function is expressed by third function including at least one of a polynomial function, exponential function, and reciprocal function of the temperature, and further a plurality of coefficients of the second function and the third function are expressed by functions of the specified parameter.

20. A battery power supply system including the device for determining state of a battery according to claim 15.

* * * * *